US010580709B2

(12) United States Patent
Cheng et al.

(10) Patent No.: US 10,580,709 B2
(45) Date of Patent: *Mar. 3, 2020

(54) FLIPPED VERTICAL FIELD-EFFECT-TRANSISTOR

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/197,692

(22) Filed: Nov. 21, 2018

(65) Prior Publication Data

US 2019/0096775 A1     Mar. 28, 2019

Related U.S. Application Data

(63) Continuation of application No. 15/848,151, filed on Dec. 20, 2017, now Pat. No. 10,141,234, which is a
(Continued)

(51) Int. Cl.
*H01L 27/148* (2006.01)
*H01L 29/76* (2006.01)
(Continued)

(52) U.S. Cl.
CPC .......... *H01L 22/22* (2013.01); *H01L 21/6835* (2013.01); *H01L 21/76895* (2013.01);
(Continued)

(58) Field of Classification Search
CPC .......... H01L 29/4236; H01L 29/42372; H01L 29/7397; H01L 29/7813; H01L 29/66666;
(Continued)

(56) References Cited

U.S. PATENT DOCUMENTS 6,518,112 B2   2/2003   Armacost et al.
6,770,534 B2   8/2004   Cho et al.
(Continued)

FOREIGN PATENT DOCUMENTS

CN   103280464   9/2013
CN   104201195   12/2014

OTHER PUBLICATIONS

Sun, M.C., et al., "Comparative Study on Top- and Bottom-Source Vertical-Channel Tunnel Field-Effect Transistors", The Institute of Electronics, Information and Communication Engineers Transactions on Electronics, May 2012, pp. 1-3, vol. 95, No. 5.
(Continued)

*Primary Examiner* — Hsien Ming Lee
(74) *Attorney, Agent, or Firm* — Fleit Intellectual Property Law; Thomas S. Grzesik

(57) ABSTRACT

Various embodiments disclose a method for fabricating vertical transistors. In one embodiment, a structure is formed comprising at least a first substrate, an insulator layer on the substrate, a first doped layer on the insulator layer, at least one fin structure in contact with the doped layer, a dielectric layer surrounding a portion of the fin structure, a gate layer on the dielectric layer, a second doped layer in contact with the fin structure, a first contact area in contact with the second doped layer, and at least a first interconnect in contact with the first contact area. The structure is flipped bonded to a second substrate. The first substrate and the insulator layer are removed to expose the first doped layer. A second contact area is formed in contact with the first doped layer. At least a second interconnect is formed in contact with the second contact area.

20 Claims, 23 Drawing Sheets

Related U.S. Application Data continuation of application No. 15/497,608, filed on Apr. 26, 2017, now Pat. No. 10,002,803, which is a continuation of application No. 15/137,036, filed on Apr. 25, 2016, now Pat. No. 9,799,655.

(51) Int. Cl.

| | | |
|---|---|---|
| *H01L 21/66* | (2006.01) | |
| *H01L 27/092* | (2006.01) | |
| *H01L 29/78* | (2006.01) | |
| *H01L 29/66* | (2006.01) | |
| *H01L 21/768* | (2006.01) | |
| *H01L 23/535* | (2006.01) | |
| *H01L 29/786* | (2006.01) | |
| *H01L 21/683* | (2006.01) | |
| *H01L 21/84* | (2006.01) | |
| *H01L 23/50* | (2006.01) | |
| *H01L 23/528* | (2006.01) | |
| *H01L 27/12* | (2006.01) | |
| *H01L 21/8238* | (2006.01) | |

(52) U.S. Cl.
CPC ...... *H01L 21/823821* (2013.01); *H01L 21/84* (2013.01); *H01L 23/50* (2013.01); *H01L 23/5286* (2013.01); *H01L 23/535* (2013.01); *H01L 27/0924* (2013.01); *H01L 27/1203* (2013.01); *H01L 29/66666* (2013.01); *H01L 29/66795* (2013.01); *H01L 29/785* (2013.01); *H01L 29/7827* (2013.01); *H01L 29/78642* (2013.01); *H01L 21/823885* (2013.01); *H01L 27/092* (2013.01); *H01L 2221/68359* (2013.01)

(58) Field of Classification Search
CPC .......... H01L 29/66909; H01L 29/7828; H01L 29/7788; H01L 29/7827; H01L 29/78642; H01L 29/7926; H01L 27/0886; H01L 27/0924; H01L 27/10841; H01L 27/11556; H01L 27/11557
USPC ........ 257/220, 263, 328, 330, 331; 438/156, 438/173
See application file for complete search history.

(56) References Cited

U.S. PATENT DOCUMENTS

| | | |
|---|---|---|
| 7,683,428 B2 | 3/2010 | Chidambarrao et al. |
| 8,324,682 B2 | 12/2012 | Chen et al. |
| 8,637,849 B2 | 1/2014 | Deligianni et al. |
| 8,987,811 B2 | 3/2015 | Yu et al. |
| 9,130,054 B2 | 9/2015 | Jang et al. |
| 9,362,292 B1 | 6/2016 | Liaw |
| 9,960,164 B2 | 5/2018 | Cheng et al. |
| 10,141,234 B2 * | 11/2018 | Cheng ................ H01L 27/0924 |
| 2006/0125025 A1 | 6/2006 | Kawashima et al. |
| 2006/0261406 A1 | 11/2006 | Chen |
| 2007/0105320 A1 | 5/2007 | Yang |
| 2014/0230870 A1 | 7/2014 | Williams |
| 2014/0254246 A1 | 9/2014 | Liaw |
| 2015/0155286 A1 | 6/2015 | Chuang et al. |

OTHER PUBLICATIONS

Non Final Office Action dated Apr. 3, 2017, received for U.S. Appl. No. 15/137,036.

* cited by examiner

FLIPPED VERTICAL FIELD-EFFECT-TRANSISTOR

BACKGROUND OF THE INVENTION

The present disclosure generally relates to the field of semiconductors, and more particularly relates to vertical field-effect-transistors.

Vertical transistors are a promising option for technology scaling for 5 nm CMOS technology and beyond. Vertical field-effect-transistors (FETs) mainly comprise a bottom S/D, a vertical fin or nanowire channel, a top S/D, gate contact, and metal contacts to top and bottom S/D. Additional area is consumed in order to make contact to the bottom S/D so that the bottom S/D can be electrically accessed from the top resulting in increased device footprint and reduced device packing density.

SUMMARY OF THE INVENTION

In one embodiment, a method for fabricating vertical transistors. The method comprises forming a structure comprising at least a first substrate, an insulator layer on the substrate, a first doped layer on the insulator layer, at least one fin structure in contact with the doped layer, a dielectric layer surrounding a portion of the fin structure, a gate layer on the dielectric layer, a second doped layer in contact with the fin structure, a first contact area in contact with the second doped layer, and at least a first interconnect in contact with the first contact area. The structure is flipped and then bonded to a second substrate. The first substrate and the insulator layer are removed to expose the first doped layer. A second contact area is formed in contact with the first doped layer. At least a second interconnect is formed in contact with the second contact area.

In another embodiment, a vertical transistor is disclosed. The vertical transistor comprises a substrate. A first interconnect is formed over the substrate and a contact area. A first doped layer is formed situated over the contact area. At least one fin structure is in contact with the first doped layer. A dielectric layer is in contact with a portion of the fin structure. A metal gate layer is in contact with the dielectric layer. A second doped layer is in contact with the fin structure. At least a second interconnect is formed over the second doped layer.

In yet another embodiment, an integrated circuit is disclosed. The integrated circuit comprises at least one vertical transistor. The vertical transistor comprises a substrate. A first interconnect is formed over the substrate and a contact area. A first doped layer is formed situated over the contact area. At least one fin structure is in contact with the first doped layer. A dielectric layer is in contact with a portion of the fin structure. A metal gate layer is in contact with the dielectric layer. A second doped layer is in contact with the fin structure. At least a second interconnect is formed over the second doped layer.

In a further embodiment, a method for forming inner-cell connections within a circuit is disclosed. The method comprises coupling a first vertical field-effect-transistor (pFET) to an output line at a top-level of the circuit. A determination is made as to whether a second vertical FET is connected to the first vertical FET. In response to a second vertical FET failing to be connected to the first vertical FET, the first vertical FET is coupled to a bottom rail situated at a bottom level of the circuit. In response to a second vertical FET being connected to the first vertical FET, the first vertical FET and the second vertical FET are coupled to each other at the bottom level of the circuit. A determination is made as to whether at least a third vertical FET is connected to the second vertical FET. In response to at least a third vertical FET failing to be connected to the second vertical FET, the second vertical FET is coupled to a top rail situated at the top level of the circuit. The top level and bottom level are absent any direct interconnects there between. In response to at least a third vertical FET being connected to the second vertical FET, the second vertical FET and the third vertical FET are coupled to each other at the top level of the circuit.

In another embodiment, a circuit is disclosed. The circuit comprises a top supply rail and a top ground rail disposed within a top level of the circuit. A bottom supply rail and a bottom ground rail are disposed within a bottom level of the circuit. At least one input line is disposed within a middle level of the circuit. An output line is disposed within the top level of the circuit. At least one p-type vertical field-effect-transistor (FET) is coupled to one of the bottom supply rail and the top supply rail. At least one n-type vertical FET coupled to one of the bottom ground rail and the top ground rail.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
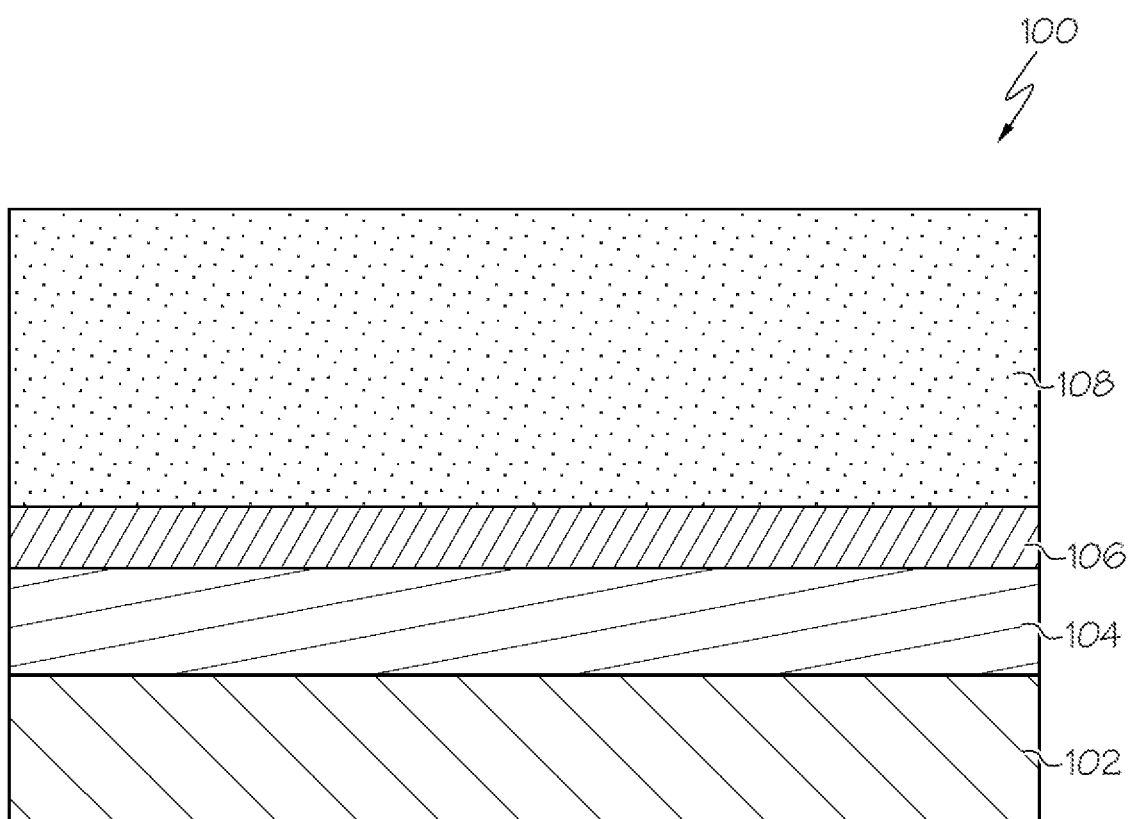
FIG. 1 is a cross-sectional view of an initial semiconductor structure according to one embodiment of the present disclosure.

It is to be understood that the present disclosure will be described in terms of a given illustrative architecture; however, other architectures, structures, substrate materials and process features and steps may be varied within the scope of the present disclosure.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Referring now to the drawings in which like numerals represent the same of similar elements, FIGS. 1-22 illustrate various processes for fabricating flipped vertical field-effect-transistors (FETs) and their interconnects. FIG. 1 shows a partially fabricated semiconductor structure 100 comprising a substrate 102, an insulator layer 104, a doped layer 106 (also referred to herein as "source/drain layer 106"), and a channel layer 108. The thickness of the substrate 102 can be, for example, from 50 microns to 1,000 microns, although lesser and greater thicknesses can be employed as well. The substrate 102 can be single crystalline and or a bulk substrate, a semiconductor-on-insulator (SOI) substrate, or a hybrid substrate. The insulator layer 104 comprises a dielectric material such as silicon oxide, silicon nitride, silicon oxynitride, or any combination thereof. In one embodiment, the insulator layer 104 is a buried oxide (BOX) layer.

The substrate 102 can be appropriately doped either with p-type dopant atoms or with n-type dopant atoms, or the material can be substantially undoped (intrinsic). The dopant concentration of the substrate 102 can be from $1.0\times10^{15}/cm^3$ to $1.0\times10^{19}/cm^3$, and in one embodiment, is from $1.0\times10^{16} cm^3$ to $3.0\times10^{18}/cm^3$, although lesser and greater dopant concentrations are applicable as well. An optional counter-doped layer (not shown) can be formed on and in contact with the substrate 102 (or buried insulator layer if formed). The counter-doped layer, in one embodiment, is formed by an epitaxial growth of a semiconductor material. The counter-doped layer may be implanted with dopants and annealed using, for example, rapid thermal anneal. Alternatively, the counter-doped layer can be doped in-situ during the epitaxial growth. The purpose of the counter-doped layer is to provide an isolation between one transistor and the next transistor.

The source/drain layer 106 is formed on and in contact with the insulator layer 104 (or counter-doped layer if formed). The source/drain layer 106 can be, for example, an n++ or a p++ doped region of the substrate 102 and can have a thickness in a range of, for example, about 10 nm to about 200 nm. However, other thicknesses are applicable as well. The source/drain layer 106 can be formed by epitaxial growth. The channel layer 108, in one embodiment, comprises a channel material. The channel material can be formed using an epitaxy process that grows a material up from the source layer 104. The channel material can be undoped or doped with either p-type or n-type dopants through ion implantation, plasma doping, or gas phase doping. P-type transistors are produced by doping the channel material with elements from group III of the periodic table (e.g., boron, aluminum, gallium, or indium). As an example, the dopant can be boron in a concentration ranging from $1 \times 10E18$ atoms/cm3 to $2 \times 10E21$ atoms/cm3. N-type transistors are produced by doping the channel material with elements from group V of the periodic table (e.g., phosphorus, antimony, or arsenic). As an example, the dopant can be phosphorus in a concentration ranging from $1 \times 10E14$ atoms/cm3 to $1 \times 10E20$ atoms/cm3.

Figure 2:
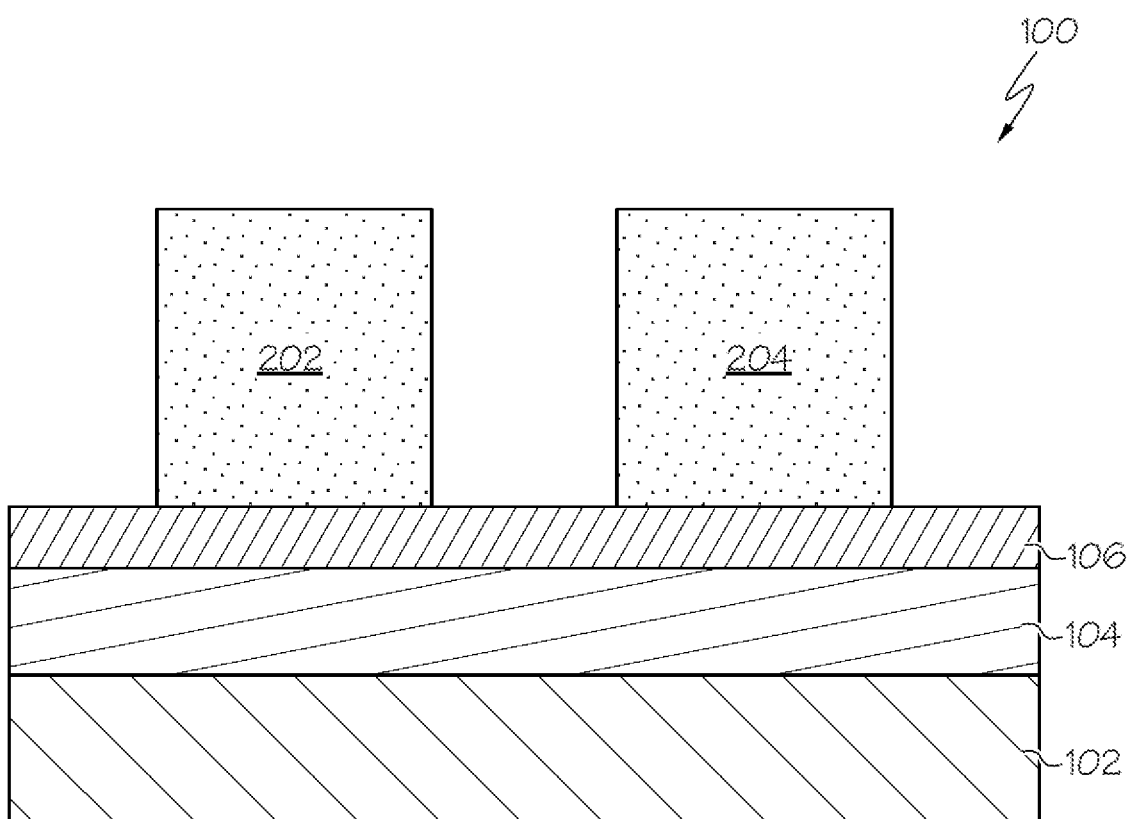
FIG. 2 is a cross-sectional view of the semiconductor structure after fin structures have been formed according to one embodiment of the present disclosure.
Figure 3:
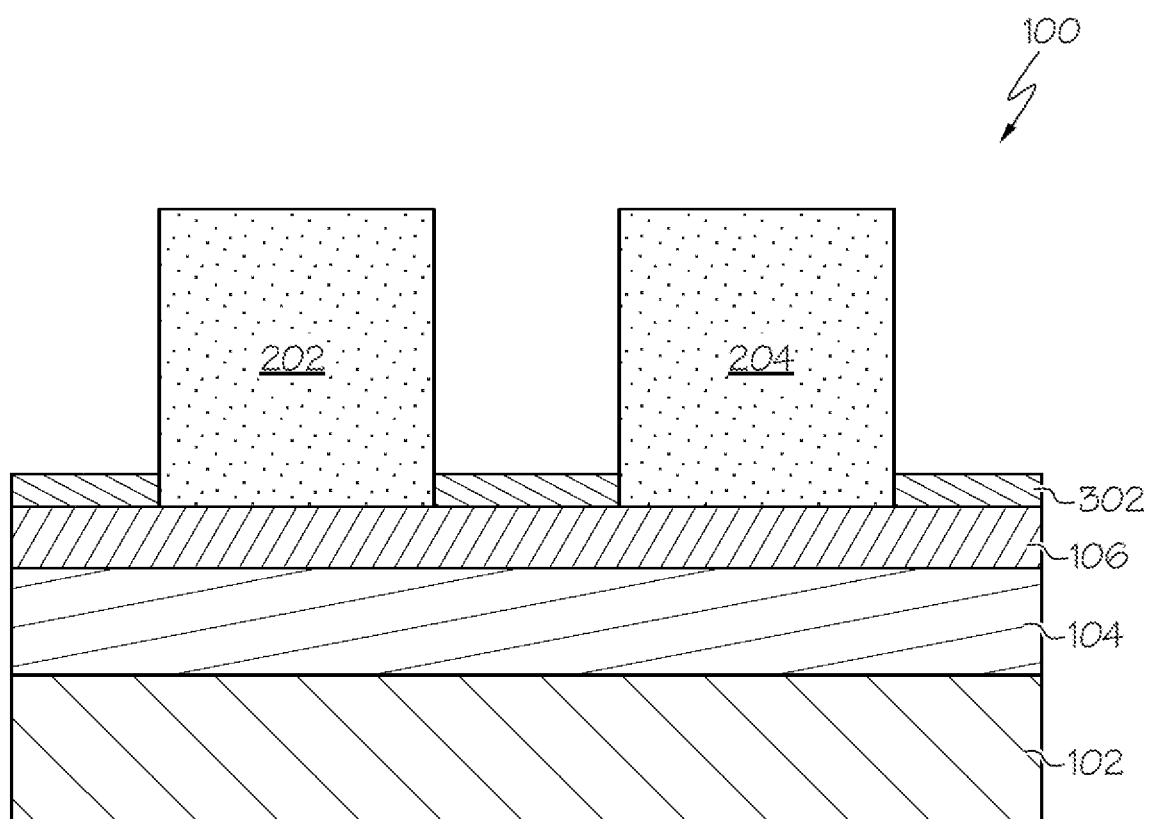
FIG. 3 is a cross-sectional view of the semiconductor structure after a first spacer layer has been formed according to one embodiment of the present disclosure.

FIG. 2 shows the semiconductor device 100 after fin structures 202, 204 have been formed in the channel layer 108. The fins 202, 204 are formed, in one embodiment, by forming an etch-stop capping layer (not shown) onto the channel material through, for example, deposition. The etch-stop capping layer, in one embodiment, may be made of silicon-nitride although other material suitable in providing etch-stop function may be used as well. One or more fin structures 202, 204 are subsequently formed or etched out of the channel material to be on top of and in contact with the source/drain layer 106 through a process involving masking, using industry-standard lithographic techniques, and directionally etching the etch-stop capping layer and underneath channel material. The directional etching process, for example a reactive-ion-etching (RIE) process, stops on the insulating layer 104. After the RIE etching process, the photo-resist mask used in the lithographic etching process can be removed. The etch-stop capping layer can also be removed as well. It should be noted that although the figures show two fin structures, embodiments of the present disclosure are After the fins 202, 204, have been formed, bottom spacers 302 are formed in contact with each of the fins 202, 204, as shown in FIG. 3. Each bottom spacer 302 contacts a top surface 304 of the source/drain layer 106 and sidewalls 306, 308 of at least one fin 202, 204. In one embodiment, the bottom spacers 302 comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structures. In one embodiment, the spacers have a thickness of, for example, 3 nm to 30 nm.

Figure 4:
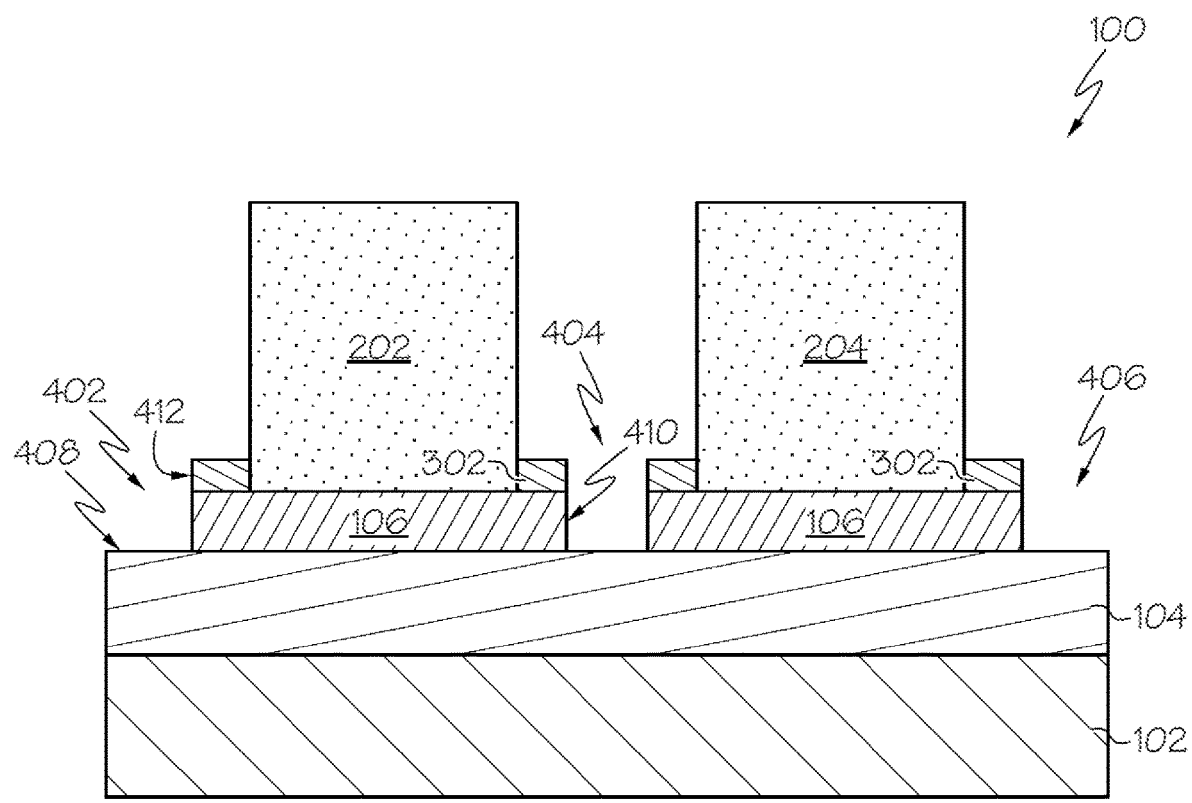
FIG. 4 is a cross-sectional view of the semiconductor structure after the first spacer layer and first doped layer have been etched according to one embodiment of the present disclosure.
Figure 5:
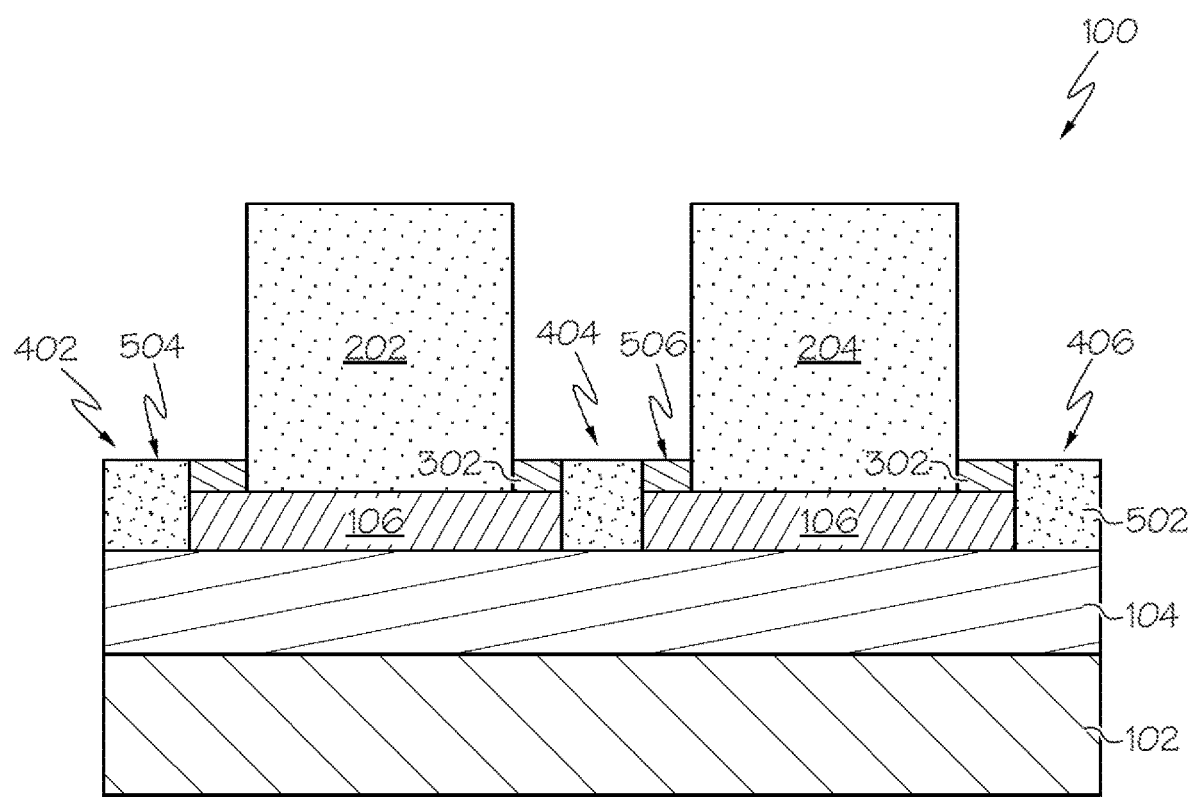
FIG. 5 is a cross-sectional view of the semiconductor structure after a dielectric layer has been formed according to one embodiment of the present disclosure.

FIG. 4 shows that once the bottom spacers 302 have been formed, a portion of the bottom spacers 302 and the source/drain layer 106 are etched using standard lithography and etching techniques. This process creates trenches 402, 404, 406 exposing a top surface 408 of the insulating layer 104 and sidewalls 410, 412 of the source/drain layer 106 and bottom spacers 302. An interlayer dielectric 502 is then deposited and followed by chemical mechanical planarization (CMP) process and followed by etching back. The interlayer dielectric 502 fills the trenches 402, 404, 406 and comprises a top surface 504 that is co-planar with the top surface 506 of the bottom spacers 302. The interlayer dielectric 502 may comprise SiO2, Si3N4, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™; other carbon-base materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable.

Figure 6:
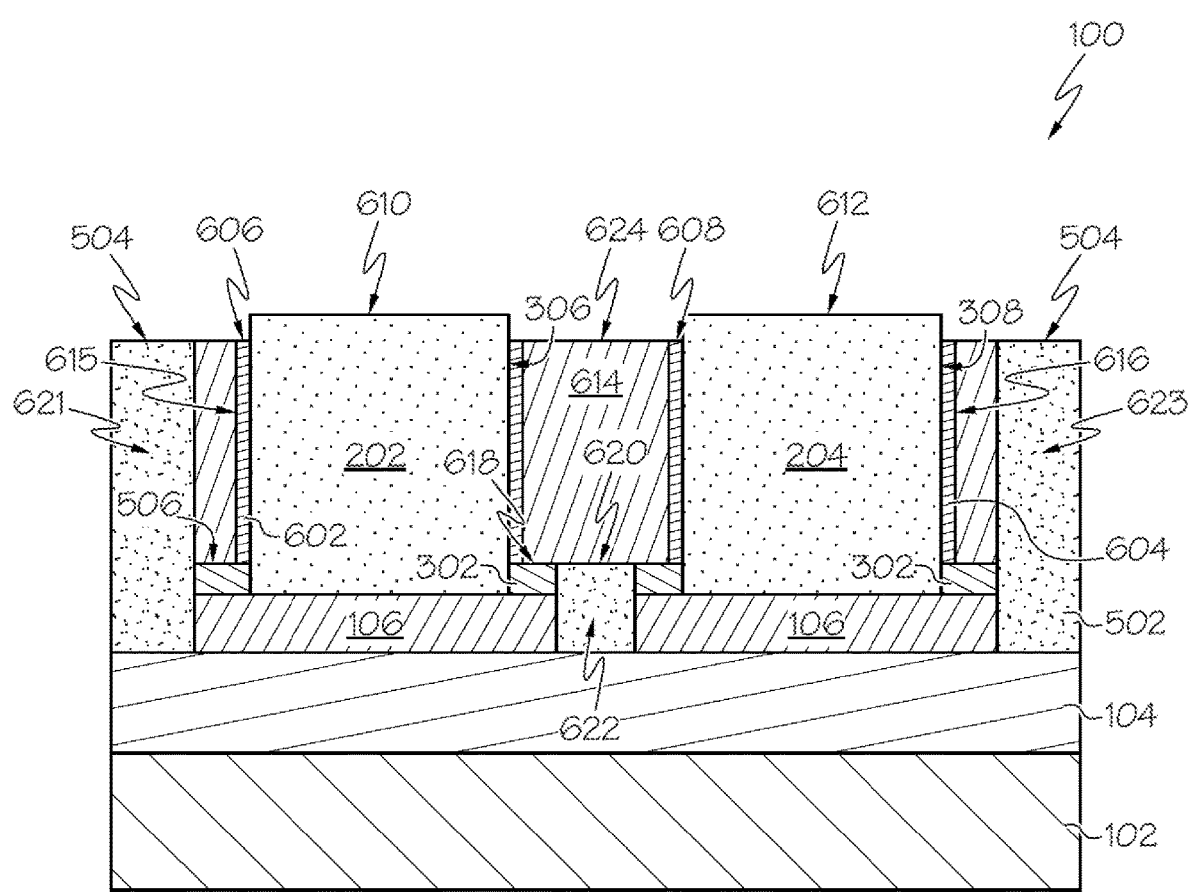
FIG. 6 is a cross-sectional view of the semiconductor structure after a high-k dielectric layer and metal gate layer have been formed according to one embodiment of the present disclosure.

A high-k dielectric material is then blanket deposited over the entire structure 100, for example by CVD (chemical vapor deposition), PECVD (plasma enhanced chemical vapor deposition), or ALD (Atomic layer deposition). Excessive high-k gate dielectric material is removed, for example, by polishing such as chemically mechanical polishing (CMP) and/or etching to form high-k gate dielectric layers 602, 604, as shown in FIG. 6. Each high-k gate dielectric layer 602, 604 is formed on and in contact with sidewalls 306, 308 of a fin 202, 204 and the top surface 506 of the bottom spacers 302. The high-k gate dielectric layers 602, 604 comprise a top surface 606, 608 that is co-planar with a top surface 610, 612 of the fins 202, 204. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k layers 602, 604 may further include dopants such as lanthanum or aluminum.

In one embodiment, the high-k layers 602, 604 are part of a layer comprising a work function metal layer (not shown). In one embodiment, the work function metal layers are formed after and conformal to the high-k layers 602, 604 employing CVD, sputtering, or plating. The work function metal layers comprise one or more metals having a function suitable to tune the work function of nFETs or pFETs. Exemplary first metals that can be employed in the work function metal layer include, but are not limited to La, Ti and Ta. The thickness of the work function metal layers can be from 3 nm to 15 nm, although lesser and greater thicknesses can also be employed.

FIG. 6 further shows that a metal gate 614 is formed around the fins 202, 204. For example, a metal gate material can be deposited by atomic layer deposition (ALD) or physical vapor deposition (PVD). In one embodiment, the metal gate 614 is a continuous metal gate that wraps around both fins 202, 204. The metal gate 614 contacts the outer sidewalls 615, 616 of the high-k gate dielectric layers 602, 604; the top surface of the remaining portion 618 of the bottom spacers 302; and a top surface 620 of a portion 622 of the interlayer dielectric 502 formed between the fins 202, 204. A top surface 624 of the metal gate 614 is co-planar with the top surface 606, 608 of the high-k dielectric layers 602, 604 and the top surface 610, 612 of the fins 202, 204. In one embodiment, the metal gate 614 comprises, for example, tungsten. Additional interlayer dielectric material is added to the interlayer dielectric 502 such that first and second portions 621, 623 of the interlayer dielectric 502 comprise a top surface 504 that is co-planar with the top surface 624 of the metal gate 614 and the top surface 606, 608 of the high-k dielectric layers 602, 604, whereas a third portion 622 of the interlayer dielectric 502 formed between the fins 202, 204 comprises a top surface 620 that is co-planer with a top-surface 506 of the bottom spacers 302.

Figure 7:
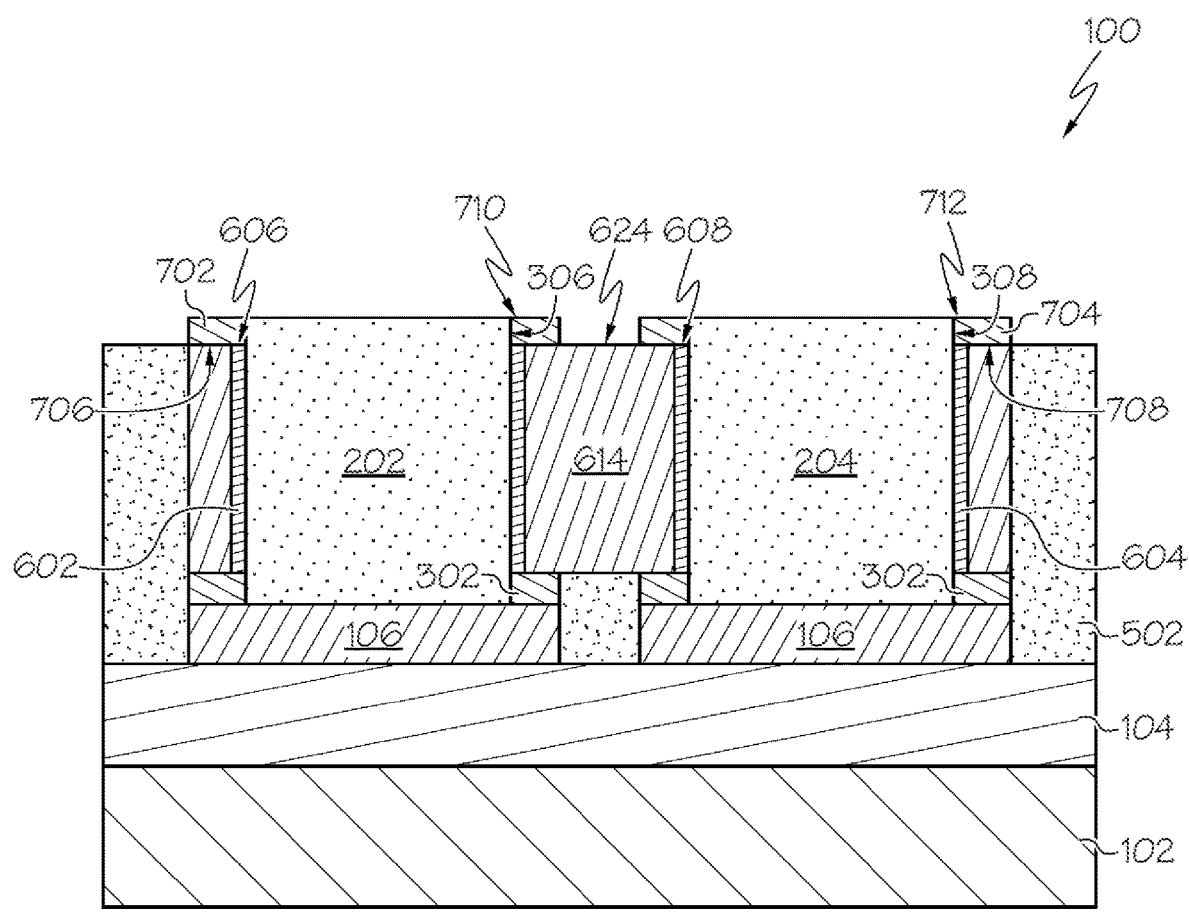
FIG. 7 is a cross-sectional view of the semiconductor structure a second spacer layer has been formed according to one embodiment of the present disclosure.

Top spacers 702, 704 are then formed on the structure 100, as shown in FIG. 7. The top spacers 702, 704 comprise a bottom surface 706, 708 that contacts the top surface 624 of the metal gate 614; the top surface 606, 608 of the high-k dielectric layers 602, 604; and portions of the sidewalls 306, 308 of the fins 202, 204 that are above the metal gate 614 and high-k dielectric layers 602, 604. The top surface 710, 712 of the top spacers 702, 704 is co-planar with the top surfaces 610, 612 of the fins 202, 204. In one embodiment, the top spacers 702, 704 comprise the same or different material as the bottom spacers 302. For example, the top spacers 702, 704 can comprise an insulating material (such as silicon oxide, silicon nitride, silicon oxynitride, or a combination of these) and can be formed using any conventional deposition process such as, for example, chemical vapor deposition (CVD) and subsequent etching techniques. The deposited spacer material is then subsequently etched to form the final spacer structures.

Figure 8:
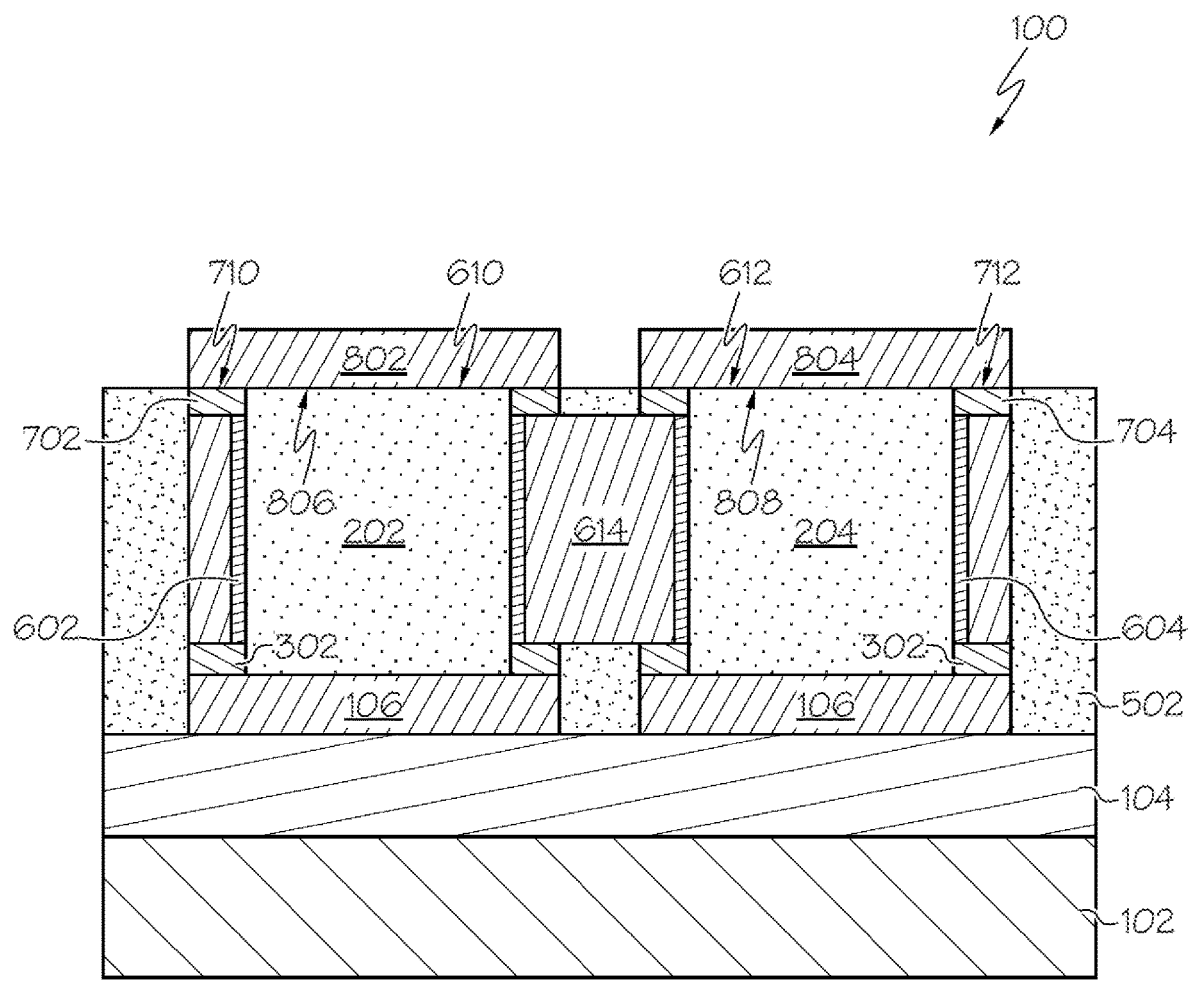
FIG. 8 is a cross-sectional view of the semiconductor structure a second doped layer has been formed according to one embodiment of the present disclosure.
Figure 9:
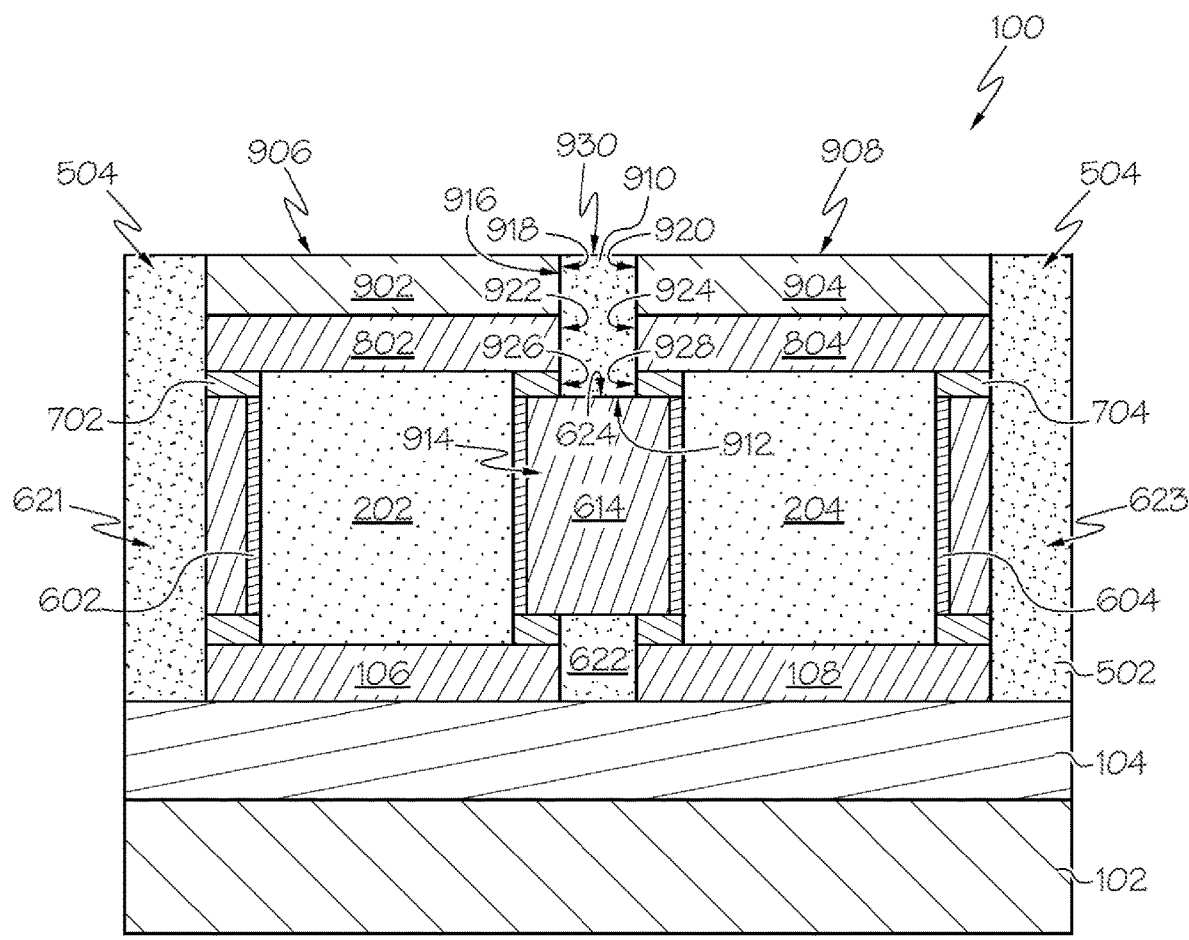
FIG. 9 is a cross-sectional view of the semiconductor structure after a first contact area has been formed according to one embodiment of the present disclosure.

A doped layer 802, 804 (also referred to herein as "source/drain layer 802, 804") is then formed on and in contact with each the fins 202, 204 and their respective top spacer 702, 704, as shown in FIG. 8. A bottom surface 806, 808 of the source/drain layers 802, 804 contacts a top surface 610, 612 of the fins 202, 204 and a top surface 710, 712 of the top spacers 702, 704. The source/drain layers 802, 804 have a thickness in a range of, for example, about 10 nm to about 200 nm. However, other thicknesses are applicable as well. The source/drain layers 802, 804 can be formed by epitaxial growth.

A metallization process is then performed to create contact areas 902, 904 on and in contact with the source/drain layers 802, 804. The metallization can involve CVD, PVD, ALD, or electroplating processes or some combination of these processes. In one embodiment, the contact areas 902, 904 comprise a width that is substantially equal to the width of the source/drain layers 802, 804 and a thickness for, for example, 10 nm to 100 nm. Interlayer dielectric material is then added to the interlayer dielectric 502 followed by chemical mechanical planarization (CMP) process such that the top surface 504 of the first and second portions 621, 623 of the interlayer dielectric 502 is co-planar with the top surface 906, 908 of the contact areas 902, 904.

The deposition of additional interlayer dielectric material also forms an interlayer dielectric 910 in between the fins 202 and above the third portion 622 of the interlayer dielectric 502. The additional interlayer dielectric 910 comprises a bottom surface 912 contacting the top surface 624 of the portion 914 of the metal gate 614 between the fins 202, 204. Sidewalls 916 of the additional interlayer dielectric 910 contact the sidewalls 918, 920 of each top spacer layer 702, 704; sidewalls 922, 924 of each source/drain layer 802, 804; and sidewalls 926, 928 of each contact areas 902, 904. A top surface 930 of the additional interlayer dielectric 910 is co-planar with the top surface of the contact areas 902, 904.

Figure 10:
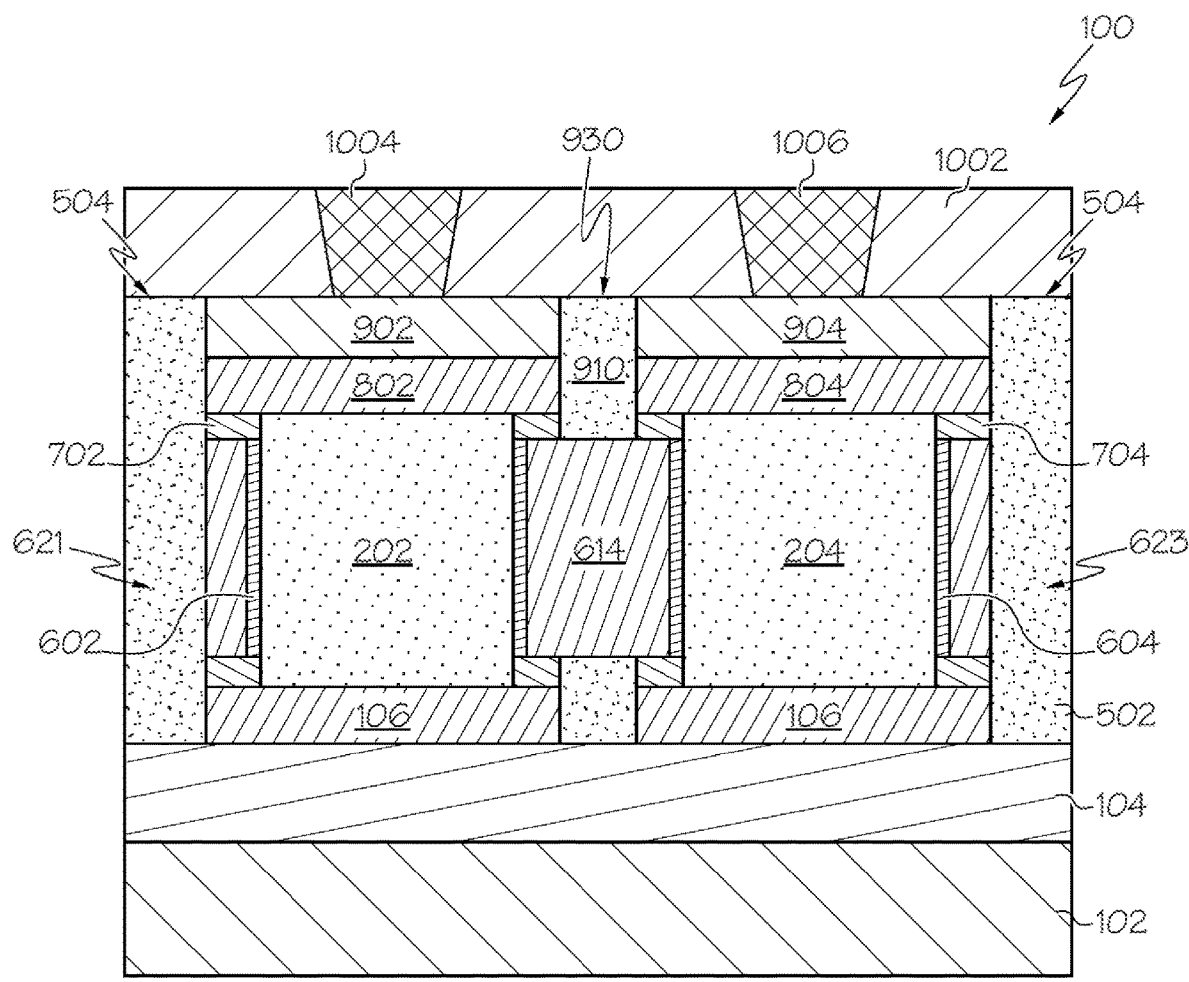
FIG. 10 is a cross-sectional view of the semiconductor structure after a first set of interconnects have been formed according to one embodiment of the present disclosure.

In one embodiment, a layer of dielectric material 1002 can be blanket deposited atop the entire structure 100 and planarized following the formation of the contact areas 902, 904, as shown in FIG. 10. The blanket dielectric may be a silicon-based material, such as SiO2, Si3N4, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™; other carbon-based materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable. The deposited dielectric 1002 is then patterned and etched to form via holes to the source/drain contact areas 902, 904. In some embodiments, a via is also created within the additional interlayer dielectric 910 exposing a portion of the gate 614.

Following via formation, interconnects 1004, 1006 are formed by depositing a conductive metal into the via holes using deposition methods, such as CVD or plating. It should be noted that in embodiments where a via is formed through the additional interlayer dielectric 910, and an interconnect (not shown) is formed in contact with the gate 614. The conductive metal may include, but is not limited to, tungsten, copper, aluminum, silver, gold and alloys thereof. Separate supply (VDD) and ground rails (GND), not shown, are also formed and electrically coupled to the interconnects 1004, 1006 via one or more embodiments discussed below. The supply (VDD) and ground rails (GND) can be formed similar to the interconnects 1004, 1006 discussed above. In another embodiment, the interconnects 1004, 1006 serve as the supply (VDD) and ground rails (GND).

Figure 11:
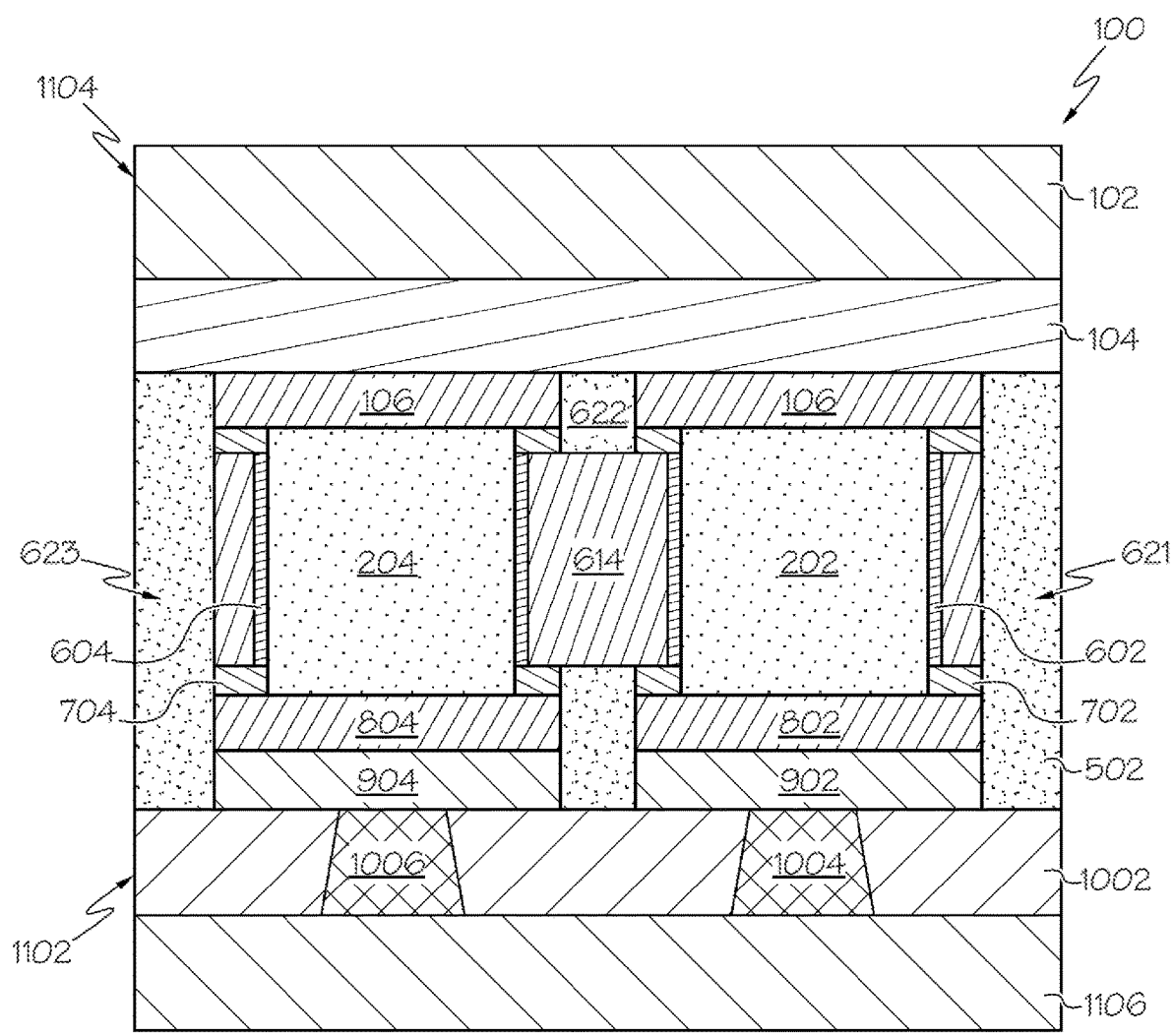
FIG. 11 is a cross-sectional view of the semiconductor structure after the structure has been flipped and bonded to a new substrate according to one embodiment of the present disclosure.

After the drain interconnects 1004, 1006 have been formed, the structure 100 is flipped/rotated 180 degrees, as shown in FIG. 11. After rotation, the bottom layer 1102 of the structure 100 comprises the dielectric material 1002 and drain interconnects 1004, 1006 and the top layer 1104 of the structure 100 comprises the original substrate 102. The bottom layer 1102 is then bonded to a new substrate 1106. Any bonding technique can be utilized to bond the bottom layer 1102 to the substrate 1106. The thickness of the new substrate 1106 can be, for example, from 50 microns to 1,000 microns, although lesser and greater thicknesses can be employed as well. The new substrate 1106 can be single crystalline and or a bulk substrate, a semiconductor-on-insulator (SOI) substrate, or a hybrid substrate.

Figure 12:
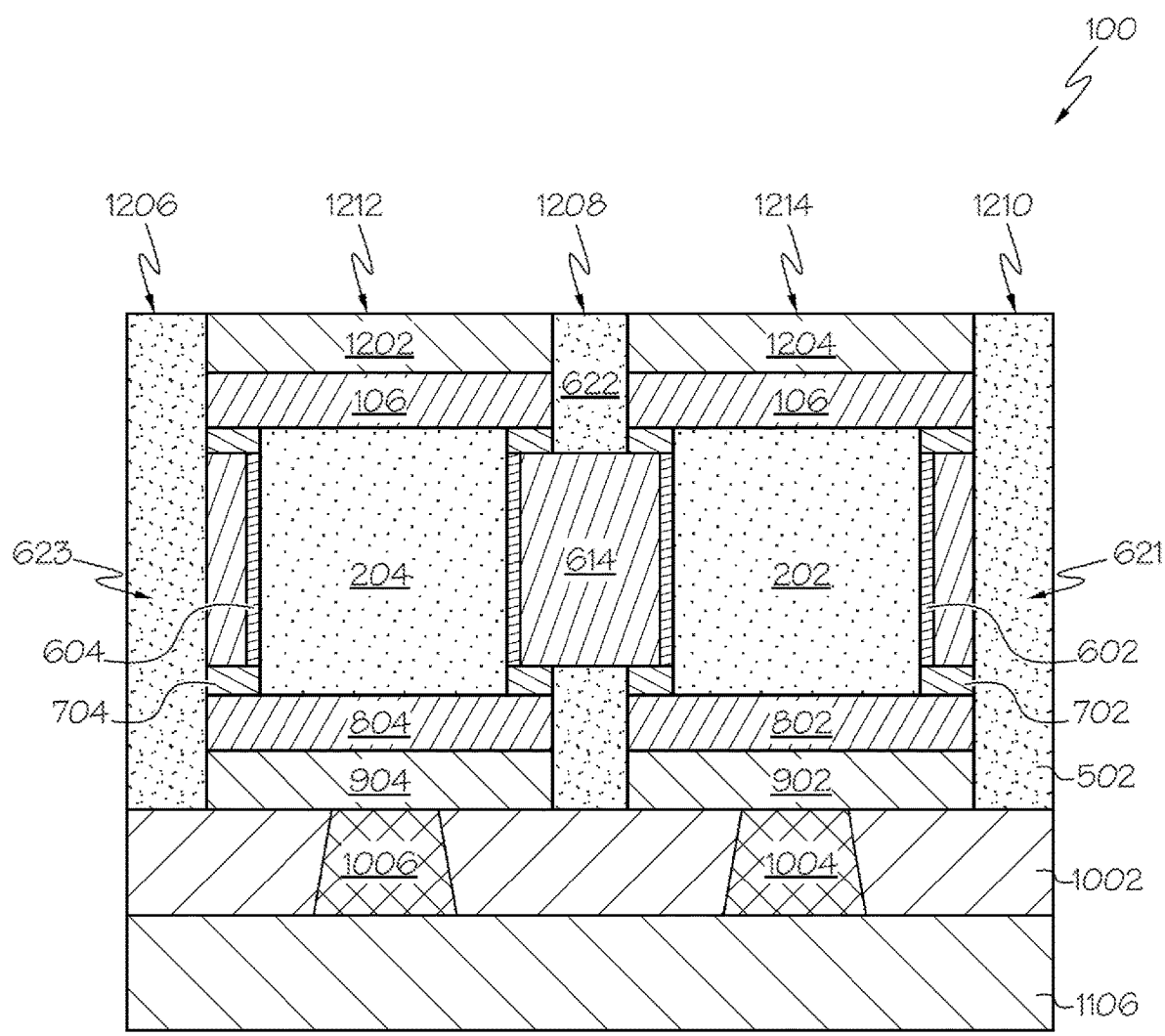
FIG. 12 is a cross-sectional view of the semiconductor structure after the original substrate and insulator layer have been removed according to one embodiment of the present disclosure.

FIG. 12 shows that the original substrate 102 and insulator layer 104 and then removed exposing the source/drain layers 106. The original substrate 102 and insulator layer 104 can be removed by, for example, a CMP process. A metallization process is then performed to create contact areas 1202, 1204 on and in contact with the source/drain layers 106. The metallization can involve CVD, PVD, ALD, or electroplating processes or some combination of these processes. In one embodiment, the contact areas 1202, 1204 comprise a width that is substantially equal to the width of the source/drain layers 106. Interlayer dielectric material is then added to the first portion 621, second portion 623, and third portion 622 of the interlayer dielectric 502 followed by chemical mechanical planarization (CMP) process such that a surface 1206, 1208, 1210 of these portions 621, 622, 623 of the interlayer dielectric 502 is co-planar with the exposed surface 1212, 1214 of the contact areas 1202, 1204.

Figure 13:
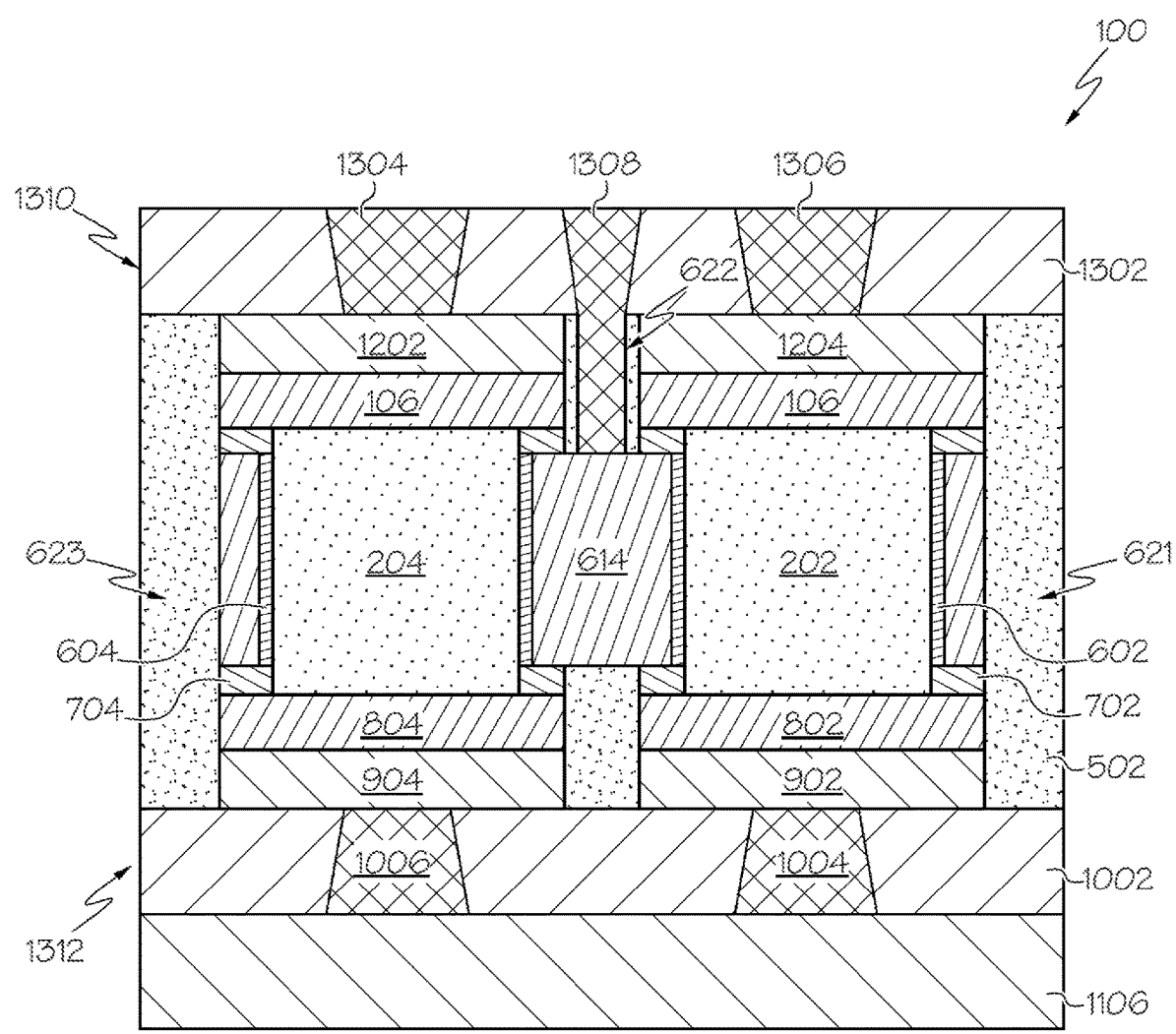
FIG. 13 is a cross-sectional view of the semiconductor structure after a second set of interconnects and a dielectric layer have been formed according to one embodiment of the present disclosure.

In one embodiment, a layer of dielectric material 1302 can be blanket deposited atop the entire structure 100 and planarized following the formation of the contact areas 1202, 1204, as shown in FIG. 13. The blanket dielectric may a silicon-based material, such as SiO2, Si3N4, SiOxNy, SiC, SiCO, SiCOH, and SiCH compounds; the above-mentioned silicon-based materials with some or all of the Si replaced by Ge; carbon-doped oxides; inorganic oxides; inorganic polymers; hybrid polymers; organic polymers such as polyamides or SiLK™; other carbon-based materials; organo-inorganic materials such as spin-on glasses and silsesquioxane-based materials; and diamond-like carbon (DLC, also known as amorphous hydrogenated carbon, α-C:H). Additional choices for the blanket dielectric include any of the aforementioned materials in porous form, or in a form that changes during processing to or from being porous and/or permeable to being non-porous and/or non-permeable. The deposited dielectric 1302 is then patterned and etched to form via holes to the contact areas 1202, 1204 and the gate 614.

Following via formation, interconnects 1304, 1306, 1308 are formed by depositing a conductive metal into the via holes using deposition methods, such as CVD or plating. The conductive metal may include, but is not limited to, tungsten, copper, aluminum, silver, gold and alloys thereof. Supply (VDD) and ground rails (GND), not shown, are also formed and electrically coupled to the interconnects 1304, 1306, 1308 via one or more embodiments discussed below.

The various embodiments discussed above form vertical FETs comprising contact areas 1202, 1202 at a top level 1310 of the structure 100 and contact areas 902, 904 at a bottom level 1312 of the structure 100 directly under the fins 202, 204. This configuration is advantageous since it reduces the FET footprint and unit cell size, and further reduces series resistance induced by bottom contacts because the current path is shortened. In addition to the above, one or more embodiments provide various interconnect configurations for the vertical FETs. These interconnect configurations avoid a connection between top and bottom contacts in any logic cell unit, which can cause added middle of line (MOL) resistance, occupy space, and add process complexity. The interconnect configurations of one or more embodiments are realized by the formation of supply (VDD) and ground (GND) rails on both the top and bottom levels of the vertical FETs.

With respect to inner-cell interconnects (connections within each type of gate), any logic relation can be expressed as sum-of-product form. For example $O=\overline{A}+\overline{BC}$. Then, the pFET portion of a gate circuit comprises parallel-connected branches each of which includes series-connected pFETs. The nFET portion comprises series-connected branches each of which includes parallel nFETs. One or more embodiments determine the level of each connection for pFETs and nFETS to supply (VDD) and ground (GND) rails, respectively, based on the following rules. It should be noted that the following rules are based on a top-level output. However, embodiments of the present disclosed are not limited to a top-level output. It should be noted that throughout the following discussion reference is made to the top-level, middle-level, and bottom-level of the circuit. The middle-level is the level where the gate metal 614 and channel 202, 204 are located. The bottom-level is defined to be between the middle-level and the final support substrate (1106 in FIG. 13). The top-level is then on the opposite side of the bottom-level.

When determining the level of each connection, each series branch of the pFETS is traced starting from the output (at the top-level of the gate circuit). The next connection after the output is to be made at the bottom-level of the circuit. The following connection is made at the top-level of the circuit. The connections alternate between the bottom and top levels of the circuit until the supply (VDD) rail is reached. The pFETs are then coupled to the supply (VDD) rail at the current level. Such procedure repeats for all pFET branches. The nFETs are traced starting at the output where the first encountered nFETs are connected at the bottom-level of the circuit. The following connection is made at the top-level of the circuit. The connections alternate between the bottom and top levels of the circuit until the ground (GND) rail is reached. The nFETs are then coupled to the ground (GND) rail at the current level.

Figure 14:
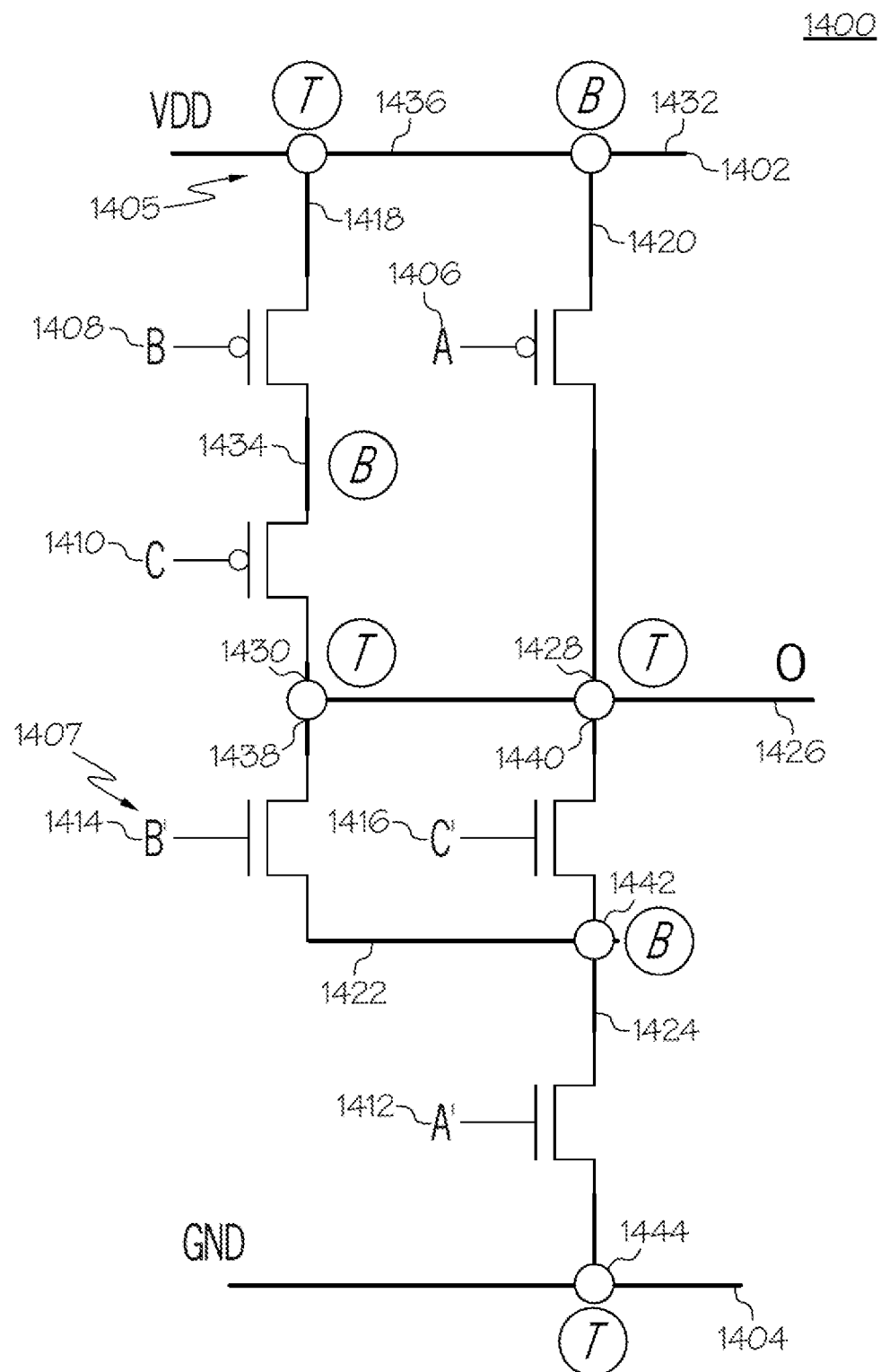
FIG. 14 is a schematic illustrating an overall example of inner-cell connections for a circuit according to one embodiment of the present disclosure.

For example, consider the gate circuit 1400 illustrated in FIG. 14. The circuit 1400 comprises supply (VDD) rails 1402 and ground (GND) rails 1404 on both the top (T) and bottom (B) levels of the circuit. The circuit 1400 also comprises a pFET portion 1405 comprising a plurality of pFETs 1406, 1408, 1410, and an nFET portion 1407 comprising a plurality of nFETs 1412, 1414, 1416. Each of the pFETs and nFETs are fabricated according the embodiments discussed above with respect to FIGS. 1-13. The pFET portion 1405 comprises parallel branches 1418, 1420 each comprising the pFETs 1412, 1414, 1416, where two or more pFETs are connected in series. The nFET portion 1407 comprises series-connected branches 1422, 1424 where 1422 comprises 1414 and 1416 connected in parallel and 1424 comprises 1412.

FIG. 14 further shows that the output 1426 is placed on the top level (T) of the circuit 1400. Starting within the pFET portion 1405 of the circuit 1400 and tracing each branch 1418, 1420 starting from the output 1426, the connection 1428, 1430 made between the drain terminal of the pFET A 1406 and the output 1426 and the drain terminal of pFET C 1410 and the output at the top level (T) of the circuit 1400. The next connection 1432, 1434 within each parallel branch 1418, 1420 is made at the bottom level (B) of the circuit 1400, and the following connection 1436 is made at the top level of the (T) of the circuit 1400.

Any subsequent connections alternate between the bottom level (B) and the top level of the (T) of the circuit 1400 until the supply rail (VDD) 1402 is reached. When the supply rail (VDD) 1402 is reached, the current pFET is connected to the supply rail (VDD) 1402 at the current level. For example, FIG. 14 shows that last connection 1436 in branch 1418 is between the source terminal of pFET B 1408 and the supply rail (VDD) 1402. The previous connection (i.e., the connection between the drain terminal of pFET B 1408 and the source terminal of pFET C 1410) was made at the bottom level (B). Therefore, the current level is at the top level of the (T) of the circuit 1400, and the connection 1436 between the source terminal of pFET B 1408 and the supply rail (VDD) 1402 at the top level of the circuit 1400.

Turning now to the nFET portion 1407 of the circuit 1400 and tracing each branch 1422, 1424 starting from the output 1426, the connection 1438 made between the drain terminal of nFET B' 1414 and the output 1426 and the connection 1440 between the drain terminal of nFET C' 1416 and the output 1426 is at the top level (T) of the circuit 1400. The next connection 1442, which connects the source terminals of the parallel nFETs 1414, 146 in the first branch 1422 and the drain terminal of the nFET 1412 in the second branch 1424, is made at the bottom level (B) of the circuit 1400. Any subsequent connections alternate between the bottom level (B) and the top level of the (T) of the circuit 1400 until the ground rail (GND) 1404 is reached. When the ground rail (GND) 1404 is reached, the current nFET is connected to the ground rail (GND) 1404 at the current level.

For example, the next connection 1442 after the output 1426, which connects the source terminals of the parallel nFETs 1414, 146 in the first branch 1422 and the drain terminal of the nFET 1412 in the second branch 1424, is made at the bottom level (B) of the circuit 1400. Then, the following connection 1444, which connects the source terminal of nFET A' 1412 to the ground rail (GND) 1404, is made at the top level of the circuit 1400. It should be noted that in one or more embodiments, the nFET-pFET pairs are aligned such that each pair can be connected by a gate line in layout. In addition, product-of-sum (POS) expression can be done similarly, e.g., O=$(\overline{C+B})\overline{A}$ where the "nFET" and "pFET" are exchanged as compared to the SOP form.

Figure 15:
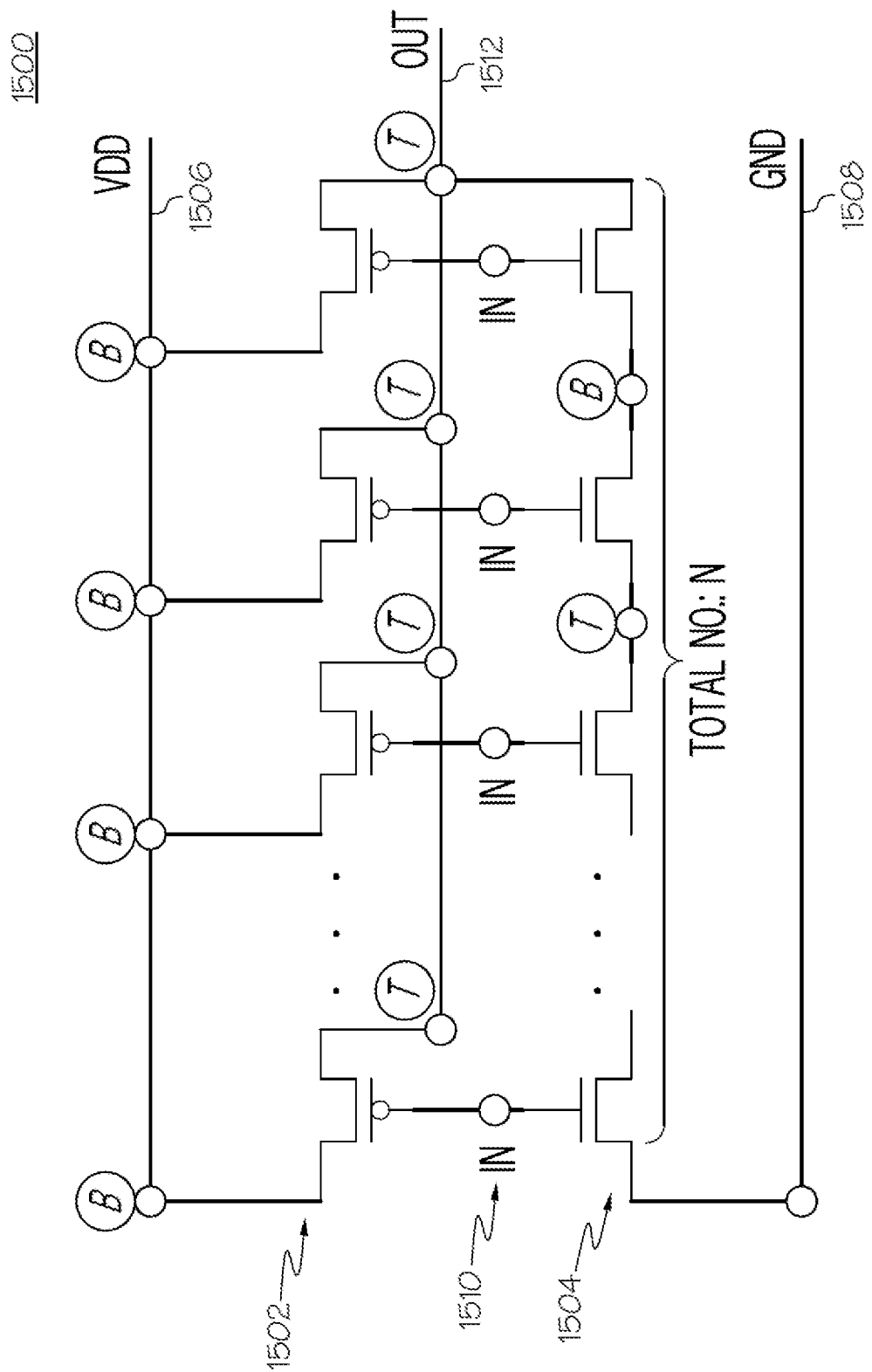
FIG. 15 is a schematic illustrating one example of inner-cell connections for a NAND gate according to one embodiment of the present disclosure.

With respect to inner-cell connections, connections made at the top level or bottom level depend on the number of transistors and the type of gate. For example, FIG. 15 shows one example of a NAND gate 1500 comprising a plurality of pFETs 1502 and a plurality of nFETs 1504. The gate 1500 also comprises top/bottom supply rails (VDD) 1506, top/bottom ground rails (GND) 1508, a plurality of inputs 1510, and an output 1512 at the top level of the (T) of the gate 1500. In a NAND gate parallel (pMOS) FETs 1502 are all connected at the bottom level (B) to the bottom supply rail (VDD) 1506. However, the connection of the series (nMOS) nFETs 1504 depends of the total number of nFETs within the circuit. For example, if the total number N of nFETs is even, the last nFET is connected at the top level (T) to the top ground (GND) rail 1508. If the total number N of nFETs is odd then the last nFET is connected at the bottom level (B) level to the bottom ground (GND) rail.

Similar rules can apply to a NOR gate. For example, all parallel (nMOS) FETs are connected at the bottom level (B) to the bottom ground (GND) rail, while the connection level of the series (pMOS) FETs depends on the total number of pFETs within the circuit. For example, if the total number N of pFETs is even, the last pFET is connected at the top level (T) to the top supply (VDD) rail. If the total number N of pFETs is odd then the last pFET is connected at the bottom level (B) level to the bottom supply (VDD) rail.

Figure 16:
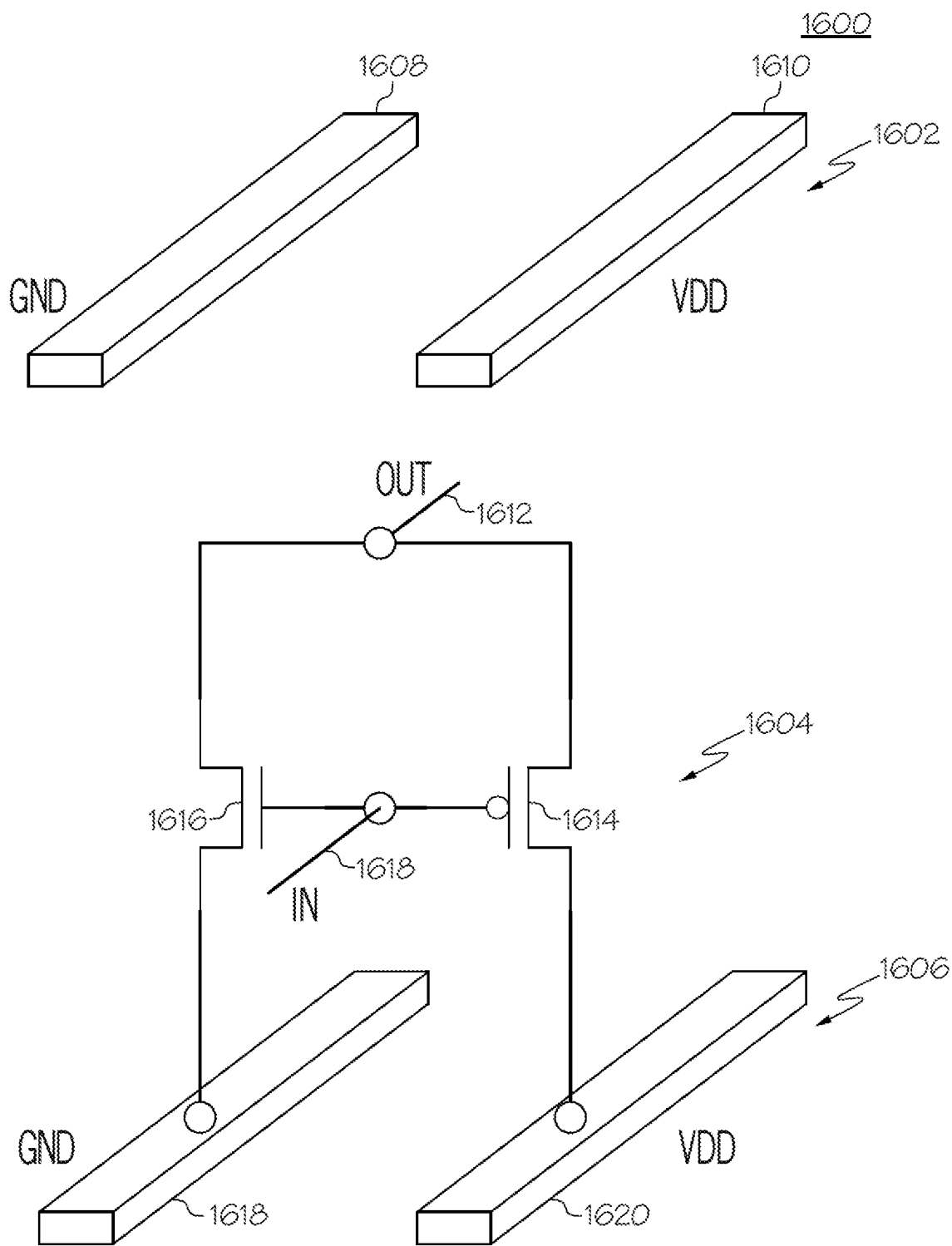
FIG. 16 is a schematic illustrating one example of inner-cell connections for an inverter according to one embodiment of the present disclosure.
Figure 17:
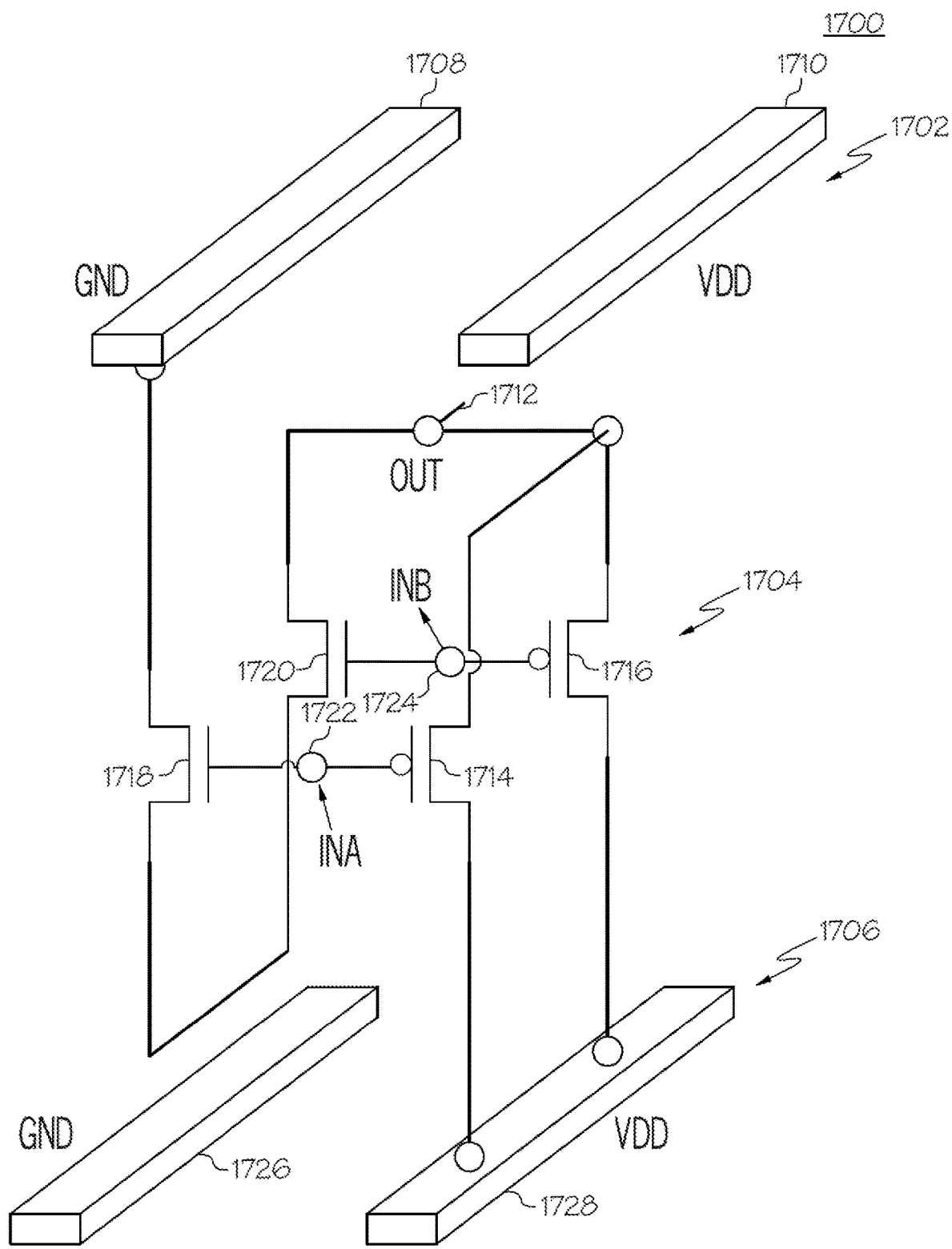
FIG. 17 is a schematic illustrating one example of inner-cell connections for a two-input NAND gate according to one embodiment of the present disclosure.
Figure 18:
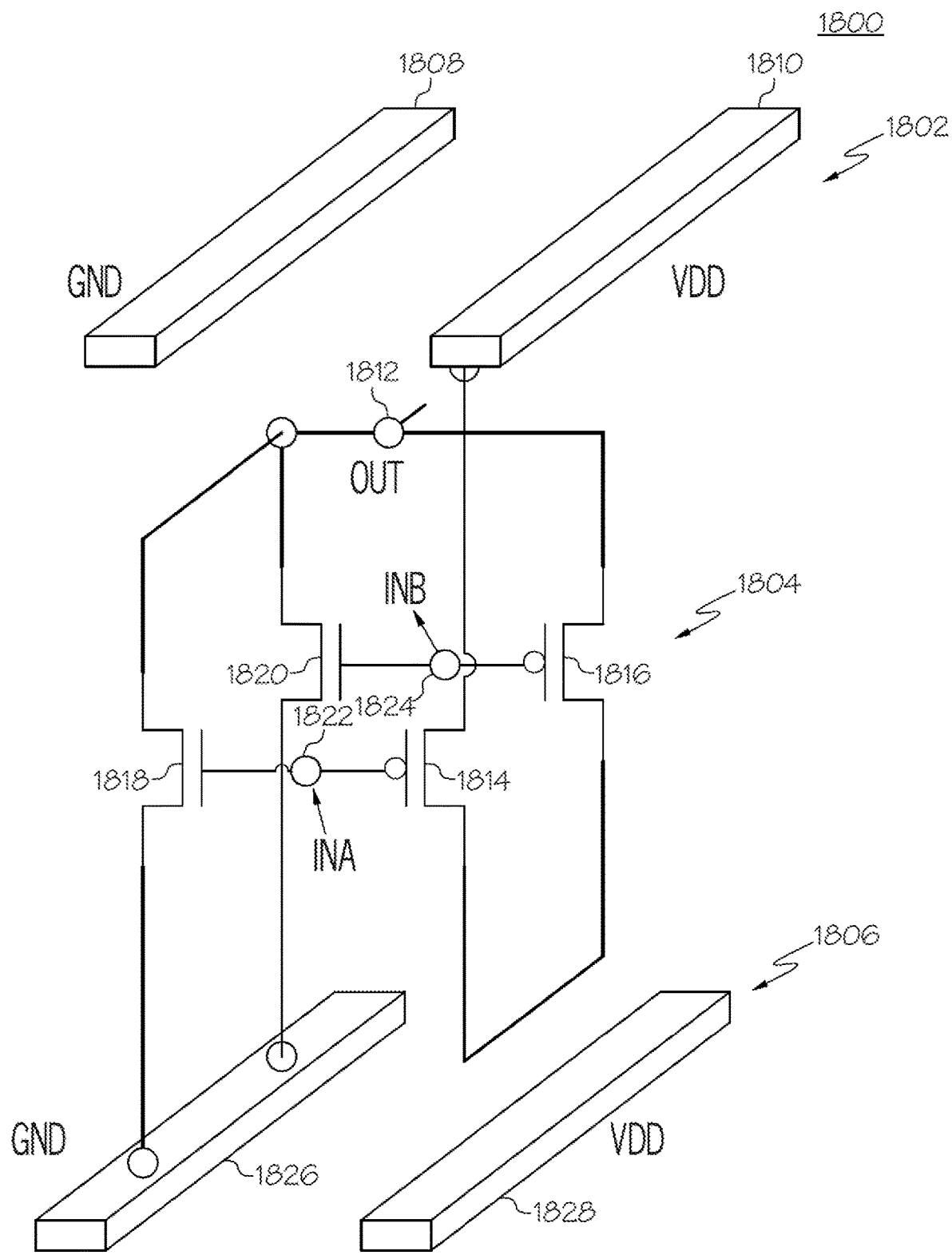
FIG. 18 is a schematic illustrating one example of inner-cell connections for a two-input NOR gate according to one embodiment of the present disclosure.
Figure 19:
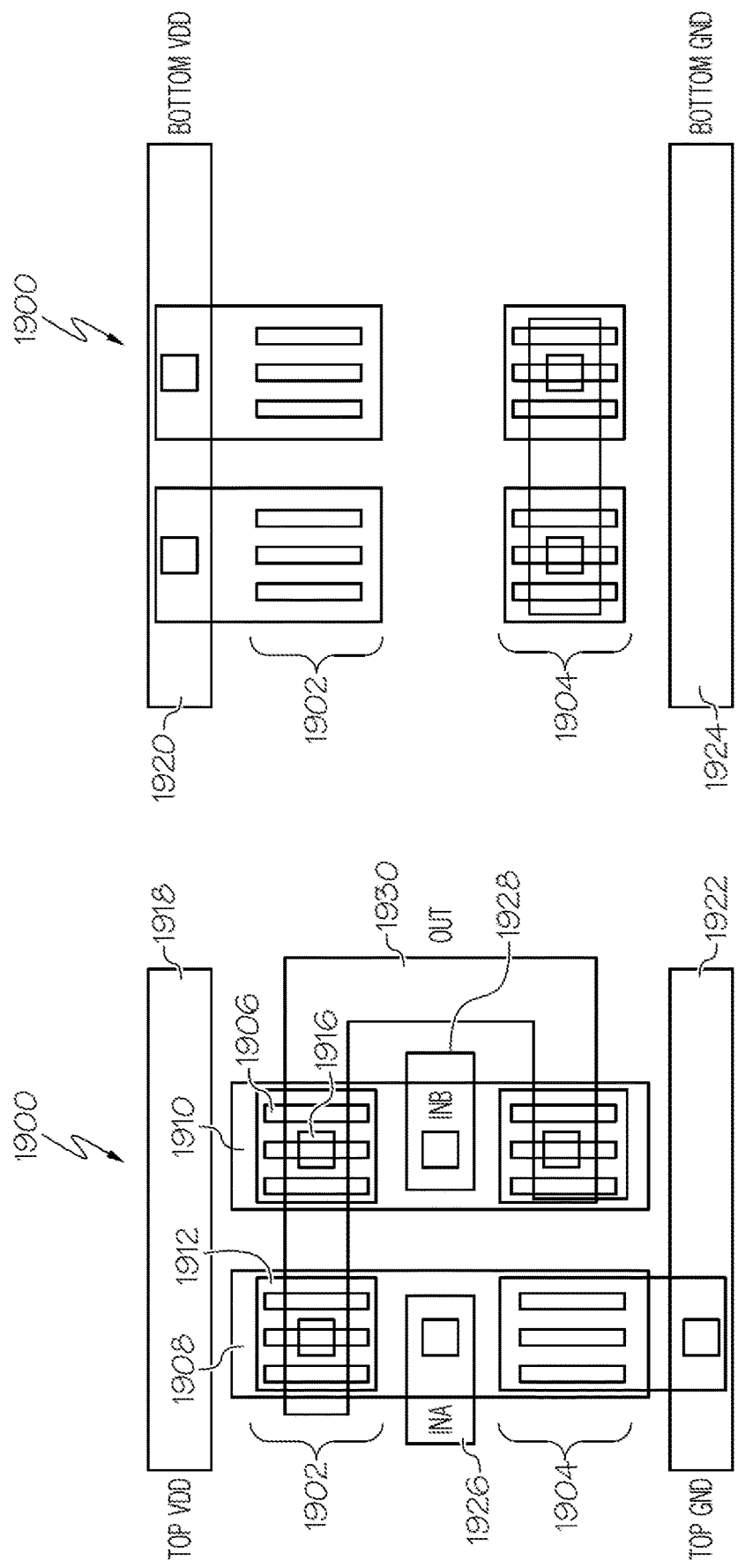
FIG. 19A is a top-view schematic of two-input NAND gate illustrating inner-cell connections according to one embodiment of the present disclosure.
FIG. 19B is a bottom-view schematic of two-input NAND gate illustrating inner-cell connections according to one embodiment of the present disclosure.

FIGS. 16-18 show examples of different gate circuits and their inter-cell connections based on the interconnect rules discussed above. FIG. 16 shows one example of an inverter gate 1600 that comprises a top-level 1602, middle-level 1604, and bottom-level 1606. The top-level 1602 comprises a top ground (GND) rail 1608, a top supply (VDD) rail 1610, and an output 1612. The middle-level 1604 comprises a pFET 1614, an nFET 1616, and an input 1618. The bottom-level 1606 comprises a bottom ground (GND) rail 1618 and a bottom supply (VDD) rail 1620. Following the rules discussed above with respect to FIGS. 14 and 15, the drain terminal of the pFET 1614 and the drain terminal of the pFET 1614 at the top level 1602 are coupled to the output 1612. The input 1618 is coupled to the pFET 1614 and nFET 1616 at the middle level 1604. The next connection in the pFET portion of the circuit is made at the bottom level of the circuit, which couples the source terminal of the pFET 1614 to the bottom supply (VDD) rail 1620. In the nFET portion of the circuit, the next connection is also made at the bottom of the circuit, which couples the source terminal of the nFET 1616 to the bottom ground (GND) rail 1618.

FIG. 17 shows one example of a two-input NAND gate 1700 that comprises a top-level 1702, middle-level 1704, and bottom-level 1706. The top-level 1702 comprises a top ground (GND) rail 1708, a top supply (VDD) rail 1710, and an output 1712. The middle-level 1704 comprises two pFETs 1714, 1716, two nFETs 1718, 1720, and two inputs 1722, 1724. The bottom level 1706 comprises a bottom ground (GND) rail 1726 and a bottom supply (VDD) rail 1728. Following the rules discussed above with respect to FIG. 14, the drain terminals of the pFETS 1714, 1716 are coupled to each other and the output 1712. The first input 1722 is coupled to a first pFET 1714 and a first nFET 1718. The second input 1724 is coupled to a second pFET 1716 and a second nFET 1720. The drain terminal of the second nFET 1720 is also coupled to the output 1712. The next connection in the pFET portion of the circuit is made at the bottom level, which couples the source terminals of the pFETs 1714, 1716 to the bottom supply (VDD) rail 1728. In the nFET portion of the circuit, a connection is made at the bottom level, which couples the nFETs 1718, 1720 to each other. The next connection is made at the top level, which couples the source terminal of the first nFET 1718 is coupled to the top ground (GND) rail 1708.

FIG. 18 shows one example of a two-input NOR gate 1800 that comprises a top-level 1802, middle-level 1804, and bottom-level 1806. The top-level 1802 comprises a top ground (GND) rail 1808, a top supply (VDD) rail 1810, and an output 1812. The middle-level 1804 comprises two pFETs 1814, 1816, two nFETs 1818, 1820, and two inputs 1822, 1824. The bottom-level 1806 comprises a bottom ground (GND) rail 1826 and a bottom supply (VDD) rail 1828. Following the rules discussed above with respect to FIG. 14, the drain terminal of the second pFET 1816 and the drain terminals of the first and second nFETs 1818, 1820 are coupled to the output 1812. The first input 1822 is coupled to the first pFET 1814 and the first nFET 1818. The second input 1824 is coupled to the second pFET 1616 and the second nFET 1820. In the pFET portion of the circuit the next connection is made at the bottom level of the circuit, which couples the drain terminal of the first pFET 1814 to the source terminal of the second pFET 1816. The next connection is made at the top level of the circuit, which couples the source terminal of the first pFET 1814 to the top supply (VDD) rail 1810. In the nFET portion of the circuit, the next connection is made at the bottom level of the circuit, which couples the source terminals of the first and second nFETs 1818, 1820 to the bottom ground (GND) rail 1826.

FIGS. 19A and 19B show top and bottom views, respectively, of a NAND cell 1900 implementing the interconnect rules of one or more embodiments. The cell 1900 comprises pFET regions 1902 and nFET regions 1904 each comprising fins 1906; gate layers 1908, 1910; S/D contact layers 1912; contact via 1916; and metal layers comprising a top supply (VDD) rail 1918, a bottom supply (VDD) rail 1920, a top ground (GND) rail 1922. A bottom ground (GND) rail 1924, inputs 1926, 1928, and an output 1930. FIG. 19A shows that the drain terminals of the pFETs are coupled to the output 1930 at the top level. The first input 1926 is coupled to a first pFET and a first nFET, while the second input 1928 is coupled to a second pFET and a second nFET. FIG. 19A further shows that drain terminal of the second nFET is also coupled to the output 1930, and the source terminal of the first nFET is coupled to the top ground (GND) rail 1922. FIG. 19B shows that the source terminals of the pFETs are coupled to the bottom supply (VDD) rail 1920, and the two nFETs are connected to each other.

Figure 20:
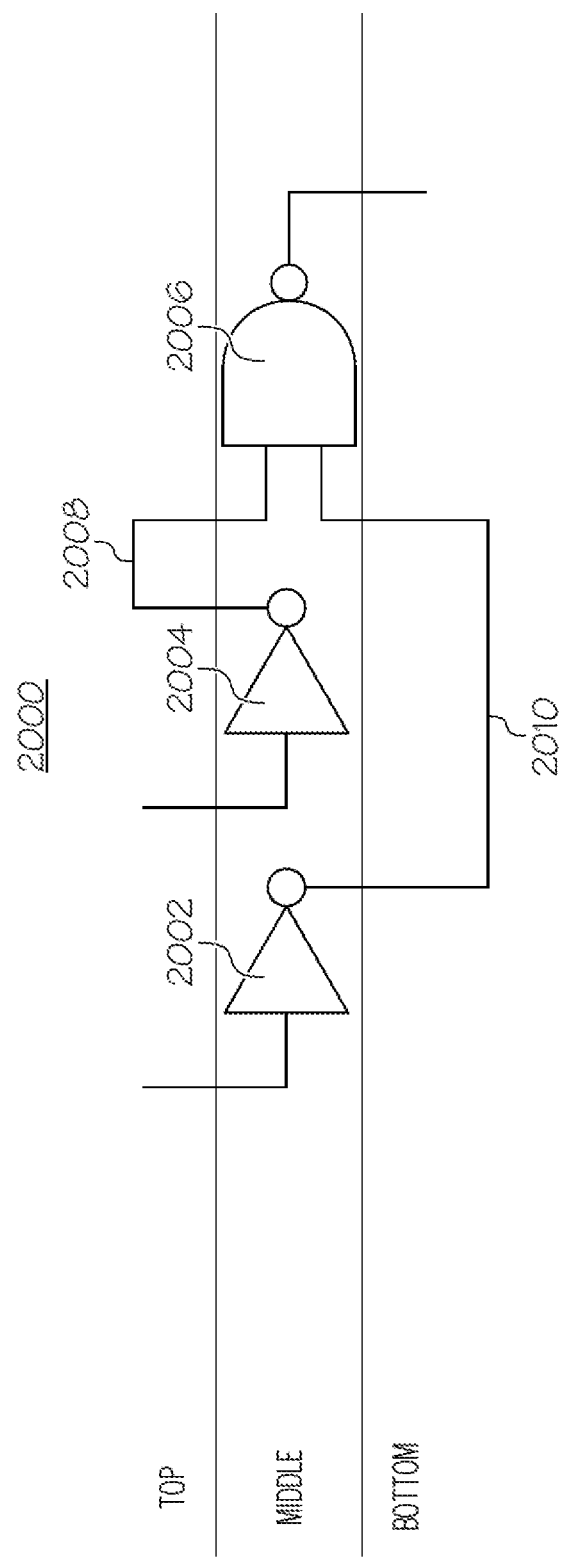
FIG. 20 is a schematic illustrating one example of inter-cell connections between different gates according to one embodiment of the present disclosure.

In addition to inner-cell connections, one or more embodiments configure inter-cell (connections between multiple cells) such that inter-cell connections do not involve any bottom level contacts. For example, all unit cells are designed and fabricated with their outputs on the top level. Since logic gate input is at the middle level (FET gate), bottom level connections are not created between different cells. However, in some embodiments, the level of outputs can be chosen such that some of the inter-cell connections are made at the bottom level (and below). This can save space for back-end-of-line (BEOL) processing. In this embodiment, at least half of the inter-cell connections can be made at the bottom level (and below). For example, FIG. 20 shows a circuit 2000 comprising a plurality of different cells 2002, 2004, 2006. At least one inter-cell connection 2008 is at the top level of the circuit, while at least half of the remaining inter-cell connections 2010 are made at the bottom level of the circuit 2000.

Figure 21:
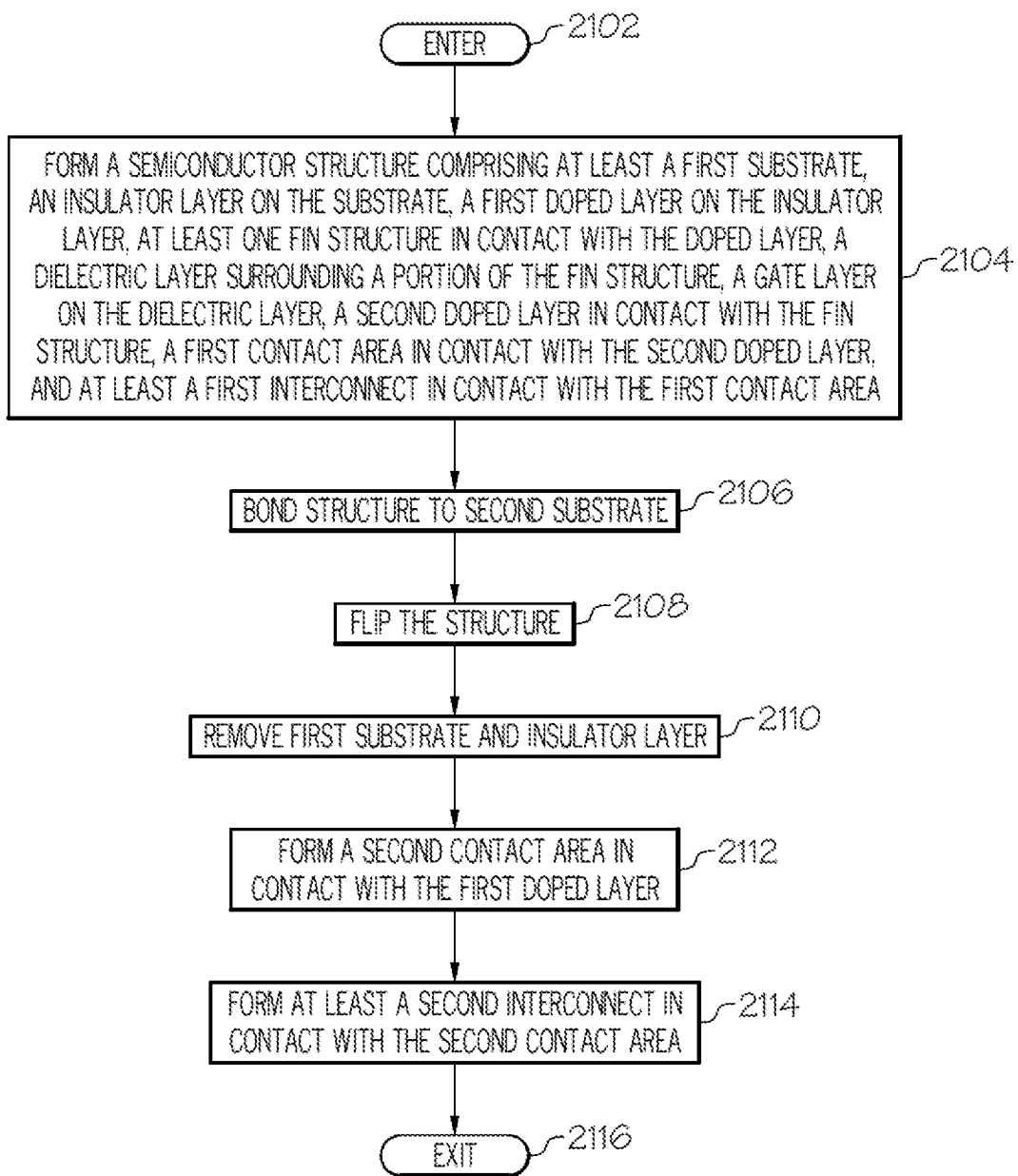
FIG. 21 is an operational flow diagram illustrating one process for forming a vertical transistors according to one embodiment of the present disclosure.

FIG. 21 is an operational flow diagram illustrating one process for fabricating vertical transistors according to one embodiment of the present disclosure. In FIG. 21, the operational flow diagram begins at step 2102 and flows directly to step 2104. It should be noted that each of the steps shown in FIG. 21 have been discussed in with respect to FIGS. 1-19. A structure 100, at step 2104, is formed comprising at least a first substrate 102, an insulator layer 104 on the substrate 102, a first doped layer 106 on the insulator layer 104, at least one fin structure 202 in contact with the doped layer 106, a dielectric layer 602 surrounding a portion of the fin structure 202, a gate layer 614 on the dielectric layer 602, a second doped layer 802 in contact with the fin structure 202, a first contact area 902 in contact with the second doped layer 802, and at least a first interconnect 1004 in contact with the first contact area 902.

The structure 100, at step 2106, is flipped. After flipping the structure 100, the structure 100 is bonded to a second substrate 1106, at step 2108. The first substrate 102 and the insulator layer 104, at step 2110, are removed to expose the first doped layer 106. A second contact area 1202, at step 2112, is formed in contact with the first doped layer 106. At least a second interconnect 1304, at step 2114, is formed in contact with the second contact area 1202. The control flow exits at step 2116.

Figure 22:
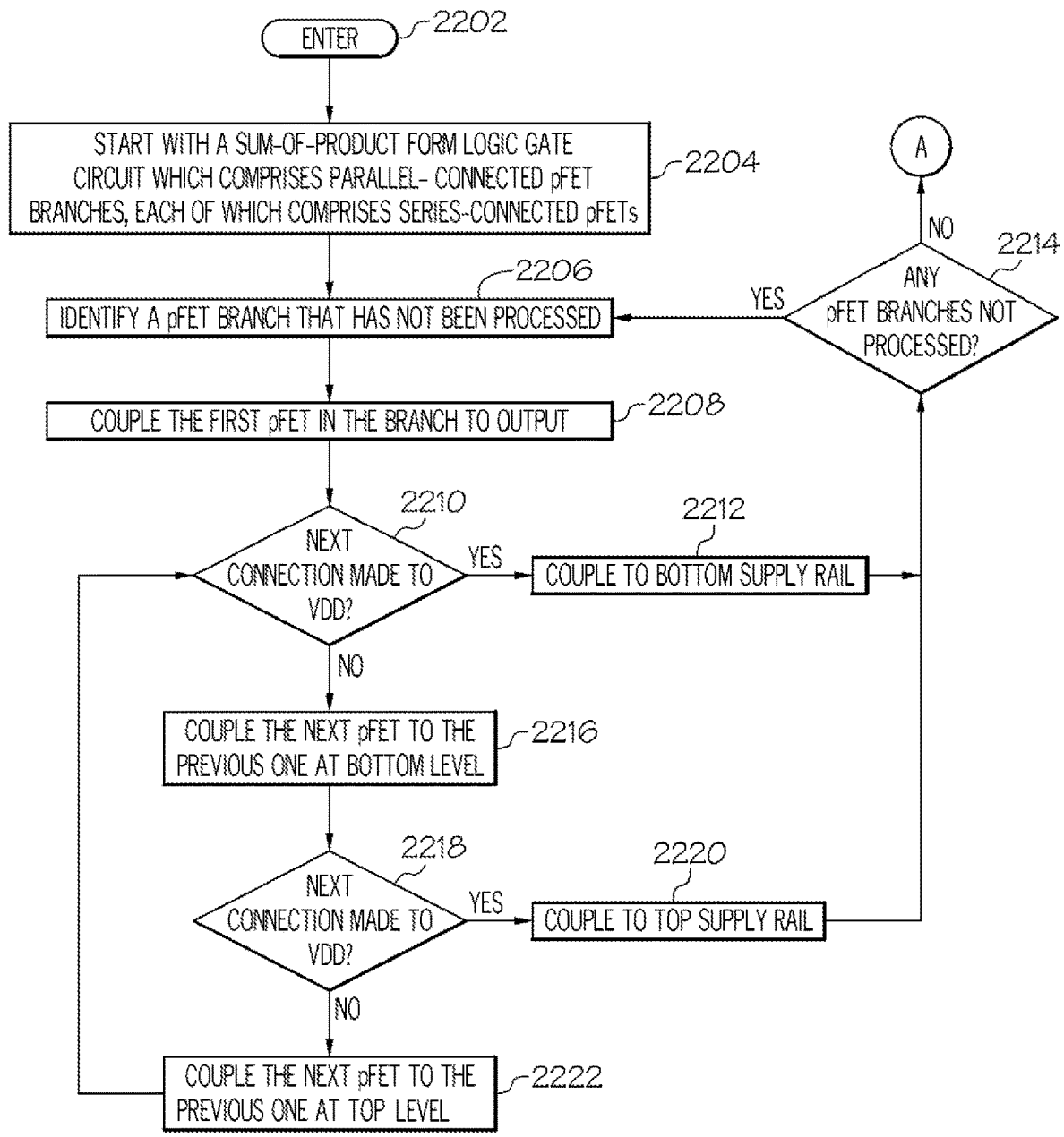
FIGS. 22 and 23 are an operational flow diagrams illustrating one process for forming inner-cell connections according to one embodiment of the present disclosure.

FIG. 22 is an operational flow diagram illustrating one process for forming inner-cell connections according to one embodiment of the present disclosure. In FIG. 22, the operational flow diagram begins at step 2202 and flows directly to step 2204. It should be noted that each of the steps shown in FIG. 22 have been discussed above with respect to FIGS. 14-19. A sum-of-product form logic gate circuit is fabricated comprising parallel-connected pFET branches and series-connected nFET branches. Each of the parallel-connected pFET branches comprises series-connected pFETs. Each of the series-connected nFETs comprises parallel-connected nFETs. The process, at step 2202, begins with the parallel-connected pFET branches. A pFET branch that has not been processed is identified at step 2206. The first pFET branch, at step 2208, is coupled to an output at step 2208.

A determination is made, at step 2210, whether the next connection will be to VDD. If the result of this determination is positive, the pFET is coupled to the bottom supply rail at step 2212. Another determination is then made, at step 2214, whether any pFET branches have not been processed. If the result of this determination is positive, the control flow returns to step 2206. If the result of this determination is negative, the control flows to entry point A of FIG. 23. If the result of the determination at step 2210 is negative, the next pFET is coupled to the previous pFET at the bottom level at step 2216. If the result of the determination at step 2210 is negative, a determination is made, at step 2218, whether the next connection will be to VDD. If the result of this determination is positive, the pFET is coupled to the top supply rail at step 2220. The control then flows to step 2214. If the result of this determination is negative, the next pFET is coupled to the previous pFET at the top level at step 2222. The control flow then returns to step 2210.

Figure 23:
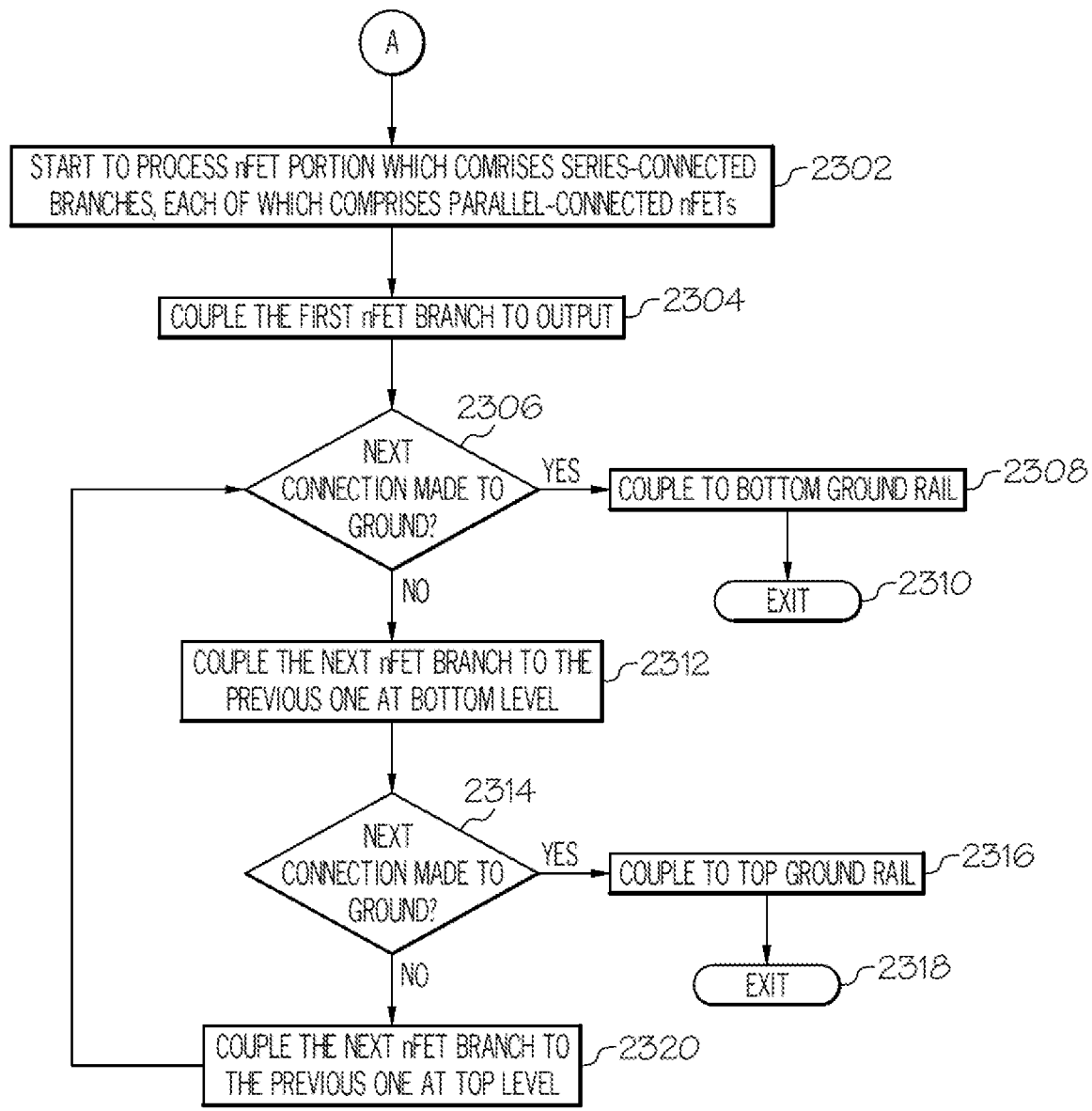

The process shown in FIG. 23 starts with the series-connected nFET branches at step 2302. The first nFET branch, at step 2304, is coupled to the output. A determination is made, at step 2306, whether the next connection will be to Ground. If the result of this determination is positive, the nFET is coupled to the bottom ground rail at step 2308. The control flow then exits at step 2310. If the result of this determination is negative, the next nFET, at step 2312, is coupled to the previous nFET at the bottom level. Another determination is then made, at step 2314, whether the next connection will be to Ground. If the result of this determination is positive, the nFET is coupled to the top ground rail at step 2316. The control then exits at step 2318. If the result of this determination is negative, the next nFET is coupled to the previous nFET at the top level at step 2320. The control flow then returns to step 2306.

Although specific embodiments of the disclosure have been disclosed, those having ordinary skill in the art will understand that changes can be made to the specific embodiments without departing from the spirit and scope of the disclosure. The scope of the disclosure is not to be restricted, therefore, to the specific embodiments, and it is intended that the appended claims cover any and all such applications, modifications, and embodiments within the scope of the present disclosure.

It should be noted that some features of the present disclosure may be used in one embodiment thereof without use of other features of the present disclosure. As such, the foregoing description should be considered as merely illustrative of the principles, teachings, examples, and exemplary embodiments of the present disclosure, and not a limitation thereof.

Also, these embodiments are only examples of the many advantageous uses of the innovative teachings herein. In general, statements made in the specification of the present application do not necessarily limit any of the various claimed disclosures. Moreover, some statements may apply to some inventive features but not to others.

What is claimed is:

1. A circuit comprising:
   a top supply rail and a top ground rail disposed within a top level of the circuit;
   a bottom supply rail and a bottom ground rail disposed within a bottom level of the circuit;
   at least one input line disposed within a middle level of the circuit;
   an output line disposed within the top level of the circuit;
   at least one p-type vertical field-effect-transistor (FET) coupled to one of the bottom supply rail and the top supply rail; and
   at least one n-type vertical FET coupled to one of the bottom ground rail and the top ground rail,
   wherein, the at least one p-type vertical FET and the at least one n-type vertical FET each comprise a bottom source/drain layer disposed below a gate structure and a top source/drain layer disposed above the gate structure.

2. The circuit of claim 1, wherein the at least one p-type vertical FET is coupled to the at least one input line, the output line, and the bottom supply rail.

3. The circuit of claim 1, wherein the at least one p-type vertical FET comprises a plurality of p-type vertical FETs, wherein each p-type vertical FET of the plurality of p-type vertical FETs is coupled to the at least one input line, the output line, and the bottom supply rail.

4. The circuit of claim 1, wherein the at least one n-type vertical FET is coupled to the at least one input line and, the output line, and the bottom ground rail.

5. The circuit of claim 1, wherein the at least one n-type vertical FET comprises a plurality of n-type vertical FETs coupled to the at least one input line and having at least one n-type vertical FET coupled to the output line, where the plurality of n-type vertical FETs comprises an even number of plurality of n-type vertical FETs, and wherein at least one n-type vertical FET in the plurality of n-type vertical FETs is coupled to the top ground rail.

6. The circuit of claim 1, wherein the at least one n-type vertical FET comprises a plurality of n-type vertical FETs coupled to the at least one input line and having at least one n-type vertical FET coupled to the output line, where the plurality of n-type vertical FETs comprises an odd number of plurality of n-type vertical FETs, and wherein at least one n-type vertical FET in the plurality of n-type vertical FETs is coupled to the bottom ground rail.

7. The circuit of claim 1, wherein the at least one p-type vertical FET comprises a plurality of p-type vertical FETs coupled to the at least one input line and having at least one p-type vertical FET coupled to the output line, where the plurality of p-type vertical FETs comprises an even number of plurality of p-type vertical FETs, and wherein at least one p-type vertical FET in the plurality of p-type vertical FETs is coupled to the top supply rail.

8. The circuit of claim 1, wherein the at least one p-type vertical FET comprises a plurality of p-type vertical FETs coupled to the at least one input line and having at least one p-type vertical FET coupled to the output line, where the plurality of p-type vertical FETs comprises an odd number of plurality of p-type vertical FETs, and wherein at least one p-type vertical FET in the plurality of p-type vertical FETs is coupled to the bottom supply rail.

9. A circuit comprising:
a top supply rail and a top ground rail disposed within a top level of the circuit;
a bottom supply rail and a bottom ground rail disposed within a bottom level of the circuit;
at least one input line disposed within a middle level of the circuit;
an output line disposed within the top level of the circuit;
at least one p-type vertical field-effect-transistor (FET) coupled to at least the output line and the bottom supply rail;
at least one n-type vertical FET coupled to at least the output line and the bottom ground rail.

10. The circuit of claim 9, wherein a source terminal of the at least one p-type vertical FET and a source terminal of the at least one n-type vertical FET are coupled to the output line.

11. The circuit of claim 9, wherein a drain terminal of the at least one p-type vertical FET is coupled to the output line.

12. The circuit of claim 9, wherein a drain terminal of the at least one n-type vertical FET is coupled to the output line.

13. The circuit of claim 9, wherein a source terminal of the at least one p-type vertical FET is coupled to the bottom supply rail, and a source terminal of the at least one n-type vertical FET is coupled to the bottom supply rail.

14. A circuit comprising:
a bottom supply rail and a bottom ground rail disposed within a bottom level of the circuit;
at least one input line disposed within a middle level of the circuit;
an output line disposed within a top level of the circuit;
a plurality of p-type vertical field-effect-transistors (FETs) coupled to the at least one input line and having at least one p-type vertical FET coupled to the output line, wherein at least one p-type vertical FET in the plurality of p-type vertical FETs is coupled to the bottom supply rail; and
at least one n-type vertical FET coupled to one of the bottom ground rail and a top ground rail.

15. The circuit of claim 14, wherein the at least one n-type vertical FET is coupled to the at least one input line and, the output line, and the bottom ground rail.

16. The circuit of claim 14, wherein the at least one n-type vertical FET comprises a plurality of n-type vertical FETs coupled to the at least one input line and having at least one n-type vertical FET coupled to the output line, where the plurality of n-type vertical FETs comprises an even number of plurality of n-type vertical FETs, and wherein at least one n-type vertical FET in the plurality of n-type vertical FETs is coupled to the top ground rail.

17. The circuit of claim 14, wherein the at least one n-type vertical FET comprises a plurality of n-type vertical FETs coupled to the at least one input line and having at least one n-type vertical FET coupled to the output line, where the plurality of n-type vertical FETs comprises an odd number of plurality of n-type vertical FETs, and wherein at least one n-type vertical FET in the plurality of n-type vertical FETs is coupled to the bottom ground rail.

18. The circuit of claim 14, wherein the plurality of p-type vertical FETs comprises an odd number of p-type vertical FETs.

19. The circuit of claim 14, wherein a source terminal of the at least one p-type vertical FET is coupled to the bottom supply rail.

20. The circuit of claim 14, wherein a source terminal of the least one n-type vertical FET is coupled to the bottom ground rail.

* * * * *